(12) United States Patent
Shibuya et al.

(10) Patent No.: US 8,445,295 B2
(45) Date of Patent: May 21, 2013

(54) SEMICONDUCTOR DEVICE AND METHOD FOR MANUFACTURING THE SAME

(75) Inventors: Akio Shibuya, Kanagawa (JP);
Katsuyoshi Tsuchiya, Kanagawa (JP);
Akira Imaizumi, Kanagawa (JP);
Hiroshi Matsumoto, Kanagawa (JP);
Shoji Tsuchioka, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 311 days.

(21) Appl. No.: 12/834,807

(22) Filed: Jul. 12, 2010

(65) Prior Publication Data

US 2011/0024911 A1 Feb. 3, 2011

(30) Foreign Application Priority Data

Jul. 29, 2009 (JP) ................................. 2009-176867

(51) Int. Cl.
*G01L 21/00* (2006.01)

(52) U.S. Cl.
USPC ............... 438/14; 438/17; 438/18; 257/48; 257/E23.129; 257/E21.521; 257/E21.54; 702/64; 702/168

(58) Field of Classification Search
USPC ...... 257/48, E23.179, E21.521–E21.524; 438/14, 438/17, 18; 702/64, 168; 73/31.06
See application file for complete search history.

(56) References Cited

U.S. PATENT DOCUMENTS

| | | | | |
|---|---|---|---|---|
| 5,956,567 | A * | 9/1999 | Tomita | 438/18 |
| 6,563,203 | B2 * | 5/2003 | Nishimura | 257/676 |
| 7,271,606 | B1 * | 9/2007 | Tang et al. | 324/754.07 |
| 2007/0279078 | A1 | 12/2007 | Iwami | |
| 2008/0290887 | A1 | 11/2008 | Yamazaki | |
| 2009/0243118 | A1 * | 10/2009 | Akiba et al. | 257/773 |

FOREIGN PATENT DOCUMENTS

| | | |
|---|---|---|
| JP | 2007-285970 A | 11/2007 |
| JP | 2008-249466 A | 10/2008 |
| JP | 2008-249467 A | 10/2008 |
| JP | 2008-292337 A | 12/2008 |

* cited by examiner

*Primary Examiner* — David Vu
*Assistant Examiner* — Cuong Nguyen
(74) *Attorney, Agent, or Firm* — Miles & Stockbridge P.C.

(57) ABSTRACT

An electrical characteristics test for a semiconductor integrated circuit using a Kelvin contact method can be conducted in a pre-process without obstructing the reduction in size of a semiconductor chip or without complicating the circuit design. A probe card in a testing apparatus includes probes for Kelvin contact, the probes for Kelvin contact including a coil probe and a POGO pin probe disposed inside the coil probe, and a probe for two-terminal measurement. Electrode pads formed in each chip area over a wafer are in a relation of A=B<2A, given that the area of one of the electrode pads with which the probe for Kelvin contact comes into contact is B and the area of the other electrode pad with which the probe for two-terminal measurement comes into contact is A.

15 Claims, 23 Drawing Sheets

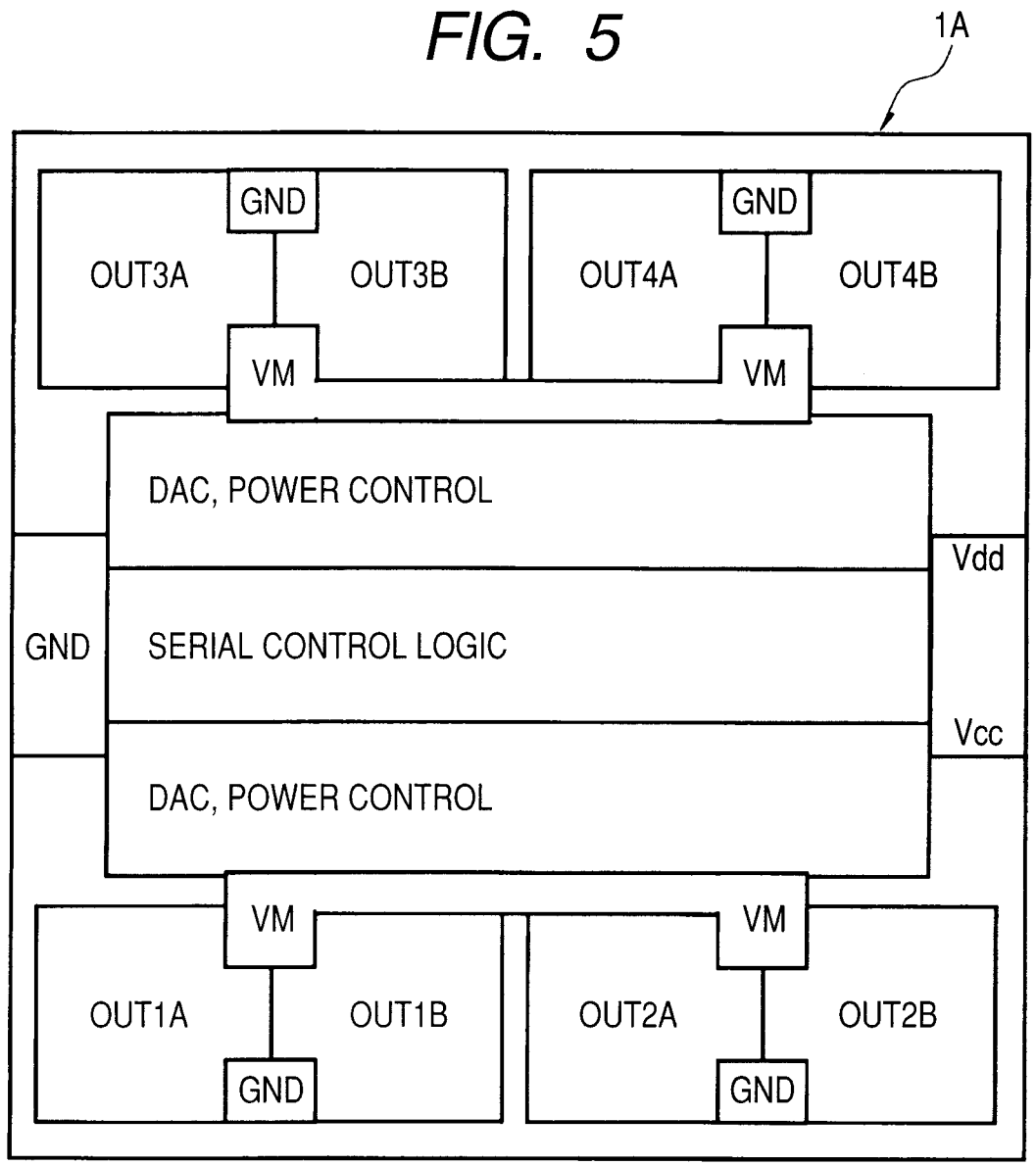

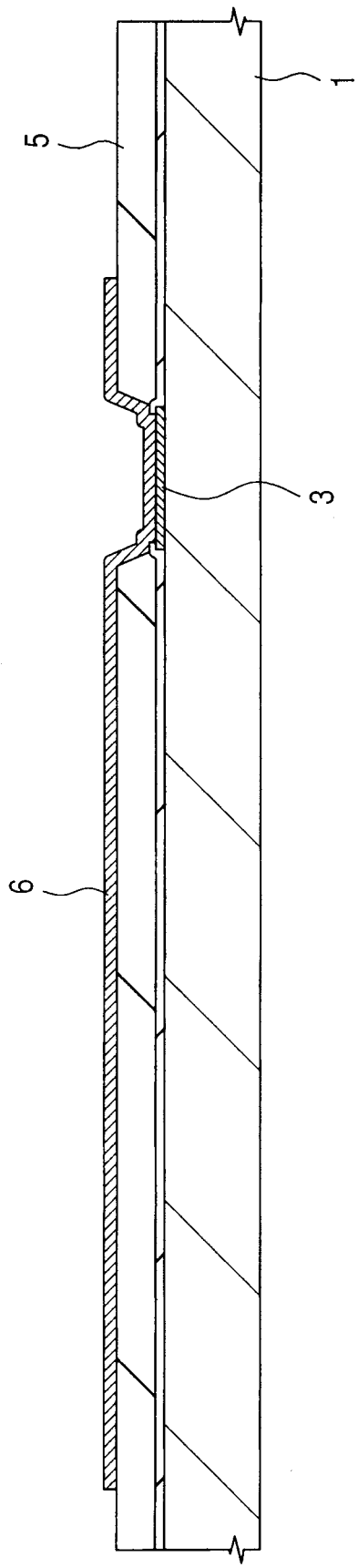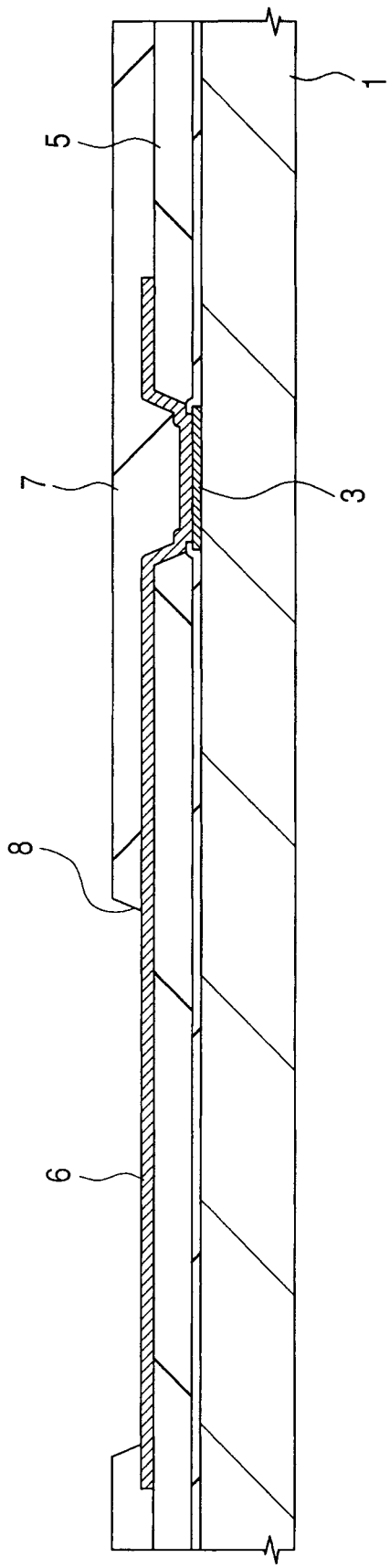

Z = IMPEDANCE TO BE MEASURED
rc1, rc2, rc1', rc2' = CONTACT RESISTANCE + LINE RESISTANCE

SEMICONDUCTOR DEVICE AND METHOD FOR MANUFACTURING THE SAME

CROSS-REFERENCE TO RELATED APPLICATIONS

The disclosure of Japanese Patent Application No. 2009-176867 filed on Jul. 29, 2009 including the specification, drawings and abstract is incorporated herein by reference in its entirety.

BACKGROUND OF THE INVENTION

The present invention relates to a semiconductor device and a technique for manufacturing the same. Particularly, the present invention is concerned with a technique applicable effectively to the manufacture of a semiconductor device and including an electrical characteristics testing process for a semiconductor integrated circuit with use of a Kelvin contact method.

A process for manufacturing a semiconductor device such as LSI or IC broadly includes a pre-process (also called a wafer process) of forming integrated circuits on a main surface (an integrated circuit-forming surface) of a semiconductor wafer, e.g., a single crystal silicon wafer, by combining, for example, photolithography technique, CVD technique, sputtering technique and etching technique and a post-process of dicing the semiconductor wafer with integrated circuits formed thereon into a plurality of individual semiconductor chips and thereafter sealing each semiconductor chip with a package such as, for example, a resin or ceramic package.

In the above manufacturing process, an electrical characteristics test called a probing test is conducted in the final step of the manufacturing process. According to the probing test, metallic search units called probes are brought into contact with surfaces of a large number of electrode pads (also called bonding pads) formed on the main surface of the semiconductor wafer to test whether constituent elements of the integrated circuits are good or bad and also check whether wiring lines which couple between the elements are in conduction or not. In the post-process there is performed an electrical characteristics test called a burn-in test. In the burn-in test, a package is inserted into a dedicated testing socket and thermal and electrical stresses are applied to the semiconductor chip within the package while contacting probes with external coupling terminals (e.g., lead terminals and solder balls) of the package to do an accelerated test of a defect of the integrated circuit.

A testing apparatus used in the above electrical characteristics test has a sample support system including a probe card, a frog ring and a wafer stage for resting thereon the semiconductor wafer as an object to be tested. The probe card is comprised of the foregoing probes and a wiring substrate serving also as a support board for the probes. A typical probe is a cantilever type tungsten (W) probe extending in an oblique direction from a lower surface of the probe card. A probe called a POGO pin or a spring probe is of a configuration wherein a contact pin is pushed against an electrode pad surface under the resilience of a coil spring. For example, it is of a structure wherein a coil spring accommodated within a metallic tube (a holding member) transmits its resilience to a contact pin through a metallic ball. When performing an electrical characteristics test with use of the above testing apparatus, if a natural oxide film is formed or a contaminant is deposited on the electrode pad surface, it is impossible to carry out an exact measurement. Therefore, when contacting a probe with the electrode pad surface, there is performed a wiping operation which involves causing the probe to slide to break the natural oxide film, thereby allowing a clean metal surface to be exposed.

In the above electrical characteristics test, for measuring, for example, a circuit resistance value (impedance), there is adopted a two-terminal measuring method wherein probes are brought into contact with both-side terminals respectively of a circuit to be tested and a voltage drop is measured upon flowing of an electric current through the circuit. In the two-terminal measuring method, however, when the impedance of the circuit to be tested is low, there occurs an error which is caused by a contact resistance between terminal and probe or a line resistance of the tester. Therefore, in the case where the impedance of the circuit to be tested is low, there is adopted, instead of the two-terminal method, a measuring method called a Kelvin contact method (or a four-terminal measuring method).

FIG. 24A is an equivalent circuit diagram of a tester, explaining the principles of the Kelvin contact method, and FIG. 24B is an equivalent circuit diagram of a tester, explaining the principles of the two-terminal measuring method.

In the case of measuring an impedance (Z) of the to-be-tested circuit in terms of a voltage drop (Vz)) upon flowing of an electric current (I) in the circuit, the two-terminal measuring method measures a voltage drop (VM) by contacting probes with both-side terminals respectively of the circuit to be tested. According to this measuring method, however, voltage drops (Vrc1, Vrc2) caused by a contact resistance between terminal and probe and a tester line resistance are added in addition to the voltage drop (Vz)) caused by the impedance (Z) of the circuit to be tested, (VM=Vz+Vrc1+Vrc2). Consequently, when the impedance (Z) of the circuit to be tested is low, a measurement error caused by the contact resistance or the wiring resistance becomes large and it is impossible to obtain a highly accurate measured value.

On the other hand, in the Kelvin contact method, there are used separated lines, namely a line (force line) for passing an electric current (I) through the circuit to be tested and a line (sense line) for measuring the voltage drop (Vz) of the circuit, and two probes (a probe coupled to the force line and a probe coupled to the sense line) are brought into contact with each of both-side terminals in the circuit to measure the voltage drop (VM). According to this measuring method, no electric current flows (i=0) in the sense line coupled to a voltmeter, so that the voltage drops caused by the foregoing contact resistance and line resistance are cancelled and it is possible to measure only the voltage drop (Vz)) caused by the impedance (Z) of the circuit to be tested, (VM=Vz).

For the above reasons the Kelvin contact method is an effective and essential method for measuring at a low resistance such products of large electric current values as, for example, motor driver products, power MOS products and regulator products.

Patent Document 1 (Japanese Unexamined Patent Publication No. 2007-285970) discloses a pin structure in a Kelvin contact measuring apparatus wherein a force pin (a force-side probe) and a sense pin (a sense-side probe) are brought into contact with an external coupling terminal (solder ball) in a semiconductor package such as BGA (Ball Grid Array) or CSP (Chip Size Package) to measure electrical characteristics.

The above force pin and sense pin are each configured so as to be capable of expansion and contraction and be urged toward the solder ball by means of a resilient member. A total number of force and sense pins for one solder ball is three or more. Both pins are disposed so as to each come one or more into contact with one solder ball. The semiconductor package is positioned so as to be capable of entering and leaving a recess of a lower socket of the measuring apparatus and the force and sense pins are supported flexibly by an upper socket frame.

Patent Document 2 (Japanese Unexamined Patent Publication No. 2008-249466) and Patent Document 3 (Japanese Unexamined Patent Publication No. 2008-249467) disclose a spiral contactor used in Kelvin contact measurement. This Kelvin contact type contactor includes a pair of contactors each having a convex spiral shape, one spiral contactor fitted in a spiral gap of the other spiral contactor. The pair of contactors are coated at least on respective side faces with an electrical insulator except contact portions for contact with terminals of an object to be tested (Patent Document 2), or are formed integrally in a state in which an electrical insulator is filled in a spiral gap (Patent Document 3). With this structure, even if fine dust gets in the groove formed between the pair of contactors, the contactors do not short with each other.

Patent Document 4 (Japanese Unexamined Patent Publication No. 2008-292337) discloses a method for testing electrical characteristics of a semiconductor device having solder balls which method permits positive wiping operation and Kelvin contact. In this testing method, cantilever type contactors are used two in a pair, the contactors each having a planar tip with a peripheral edge, a sectional diameter of the tip portion being larger than the radius of a spherical external electrode, and the contactors being supported by a support board each at a predetermined position. When the support board or the semiconductor device is pressed, the edge of each of the paired contactors comes into contact with a solder ball surface and thus Kelvin contact is made. Further, when the support board or the semiconductor device is overdriven, the edge of each contactor slides on the solder ball surface to effect wiping.

SUMMARY OF THE INVENTION

In the semiconductor manufacturing process, as noted above, an electrical characteristics test is performed in each of pre-process and post-process, but recently importance has been attached to the electrical characteristics test in the pre-process as compared with that in the post-process.

As a reason there is mentioned a point that by performing a thorough electrical characteristics test in the pre-process and determining whether an integrated circuit is good or bad (a good chip or a bad chip) there no longer is any fear of a bad chip being incorporated in an assembly in the post-process, with consequent improvement of the yield and capability of reducing the manufacturing cost of the entire semiconductor device. Moreover, the number of products of a package structure almost equal to the chip size and mounted in many cases in digital devices of mobile phones, etc., such as one called CSP (Chip Size Package), has been increasing. In relation to being mounted on a mobile phone or the like, CSP is designed small and thin and there are many cases where its reliability is somewhat sacrificed. Therefore, for avoiding product breakage and shortening of the product life, it is now required to lessen the thermal stress imposed on the integrated circuit during electrical characteristics test in the post-process. There also has been pointed out the problem that if a probe is brought into contact with an external coupling terminal (solder ball) in a package during the electrical characteristic test in the post-process, there remains a probe trace on the solder ball and the probe trace causes a packaging defect.

However, if an attempt is made to measure a circuit impedance with use of the foregoing Kelvin contact method (or four-terminal measuring method) during the electrical characteristics test in the pre-process, there arises the following problem.

In the Kelvin contact method, two probes (a force-side probe and a sense-side probe) are brought into contact with each of both-side terminals in the circuit to be tested, so if an attempt is made to perform impedance measurement by the Kelvin contact method in the pre-process, two electrode pads (an electrode pad for contact with the force-side probe and an electrode pad for contact with the sense-side probe) are needed as terminals in the circuit to be tested. Consequently, a total of four electrode pads are needed as both-side terminals in the circuit to be tested, that is, the number of electrode pads formed on a semiconductor wafer increases, thus giving rise to the problem that the reduction in size of the semiconductor chip is impeded or the circuit design becomes complicated.

It is an object of the present invention to provide a technique able to perform an electrical characteristics test for a semiconductor integrated circuit by using the Kelvin contact method in the pre-process without obstructing the reduction in size of a semiconductor chip or without making the circuit design complicated.

The above and other objects and novel features of the present invention will become apparent from the following description and the accompanying drawings.

The following is an outline of a typical invention out of the inventions disclosed herein.

A semiconductor device manufacturing method according to a preferred aspect of the present invention includes the steps of (a) providing a semiconductor wafer, the semiconductor wafer having a main surface partitioned into a plurality of chip areas, (b) forming a semiconductor integrated circuit in each of the chip areas, (c) forming a plurality of electrode pads over a surface of each of the chip areas, the electrode pads including a first electrode pad and a second electrode pad both coupled electrically to the semiconductor integrated circuit, (d) performing an electrical characteristics test for the semiconductor integrated circuit by contacting a probe with each of the electrode pads, and (e) after the step (d), dicing the semiconductor wafer into the individual chip areas, thereby obtaining a plurality of semiconductor chips, wherein the electrical characteristics test in the step (d) includes an electrical characteristics test using a Kelvin contact method in which two probes are brought into contact with the first electrode pad, and the area of the first electrode pad is smaller than twice the area of the second electrode pad.

EFFECT OF THE INVENTION

The following is a brief description of an effect obtained by the typical invention out of the inventions disclosed herein.

An electrical characteristics test for a semiconductor integrated circuit by the Kelvin contact method in the pre-process can be performed without obstructing the reduction in size of a semiconductor chip or without making the circuit design complicated.

BRIEF DESCRIPTION OF THE DRAWINGS

FIG. 5 is a layout diagram of functional blocks shown in FIG. 4;

FIG. 8 is a sectional view of a principal portion of the semiconductor wafer, showing a semiconductor device manufacturing step in the first embodiment;

FIG. 9 is a sectional view of the principal portion of the semiconductor wafer, showing a semiconductor device manufacturing step which follows FIG. 8;

DETAILED DESCRIPTION OF THE PREFERRED EMBODIMENTS

Figure 1:
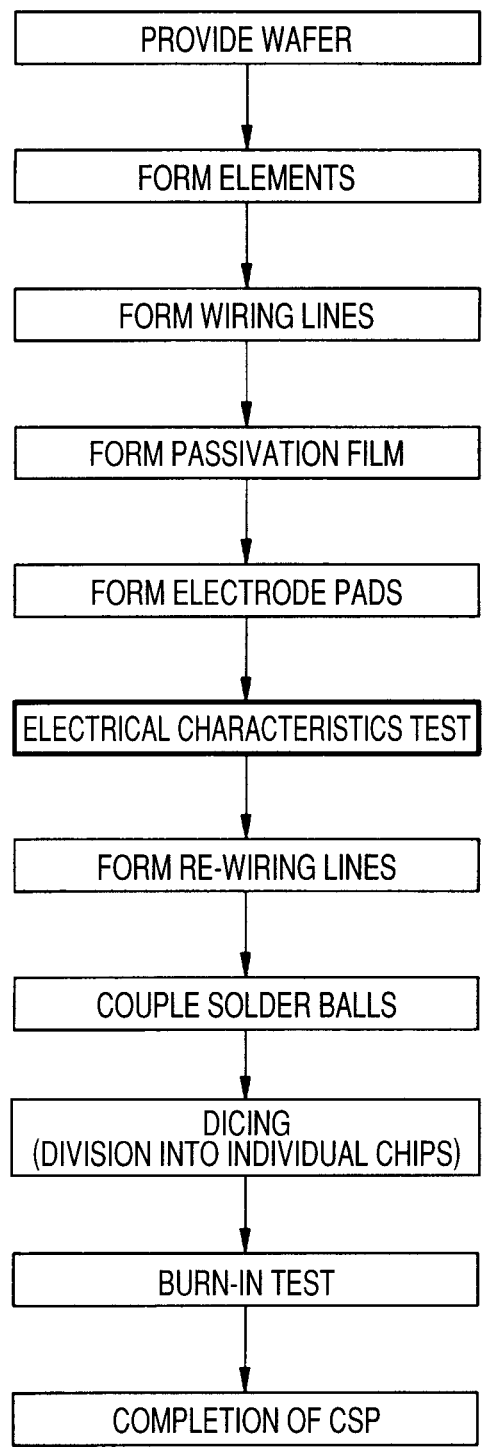
FIG. 1 is an entire flow chart showing a semiconductor device manufacturing process according to a first embodiment of the present invention.

Embodiments of the present invention will be described below in detail with reference to the drawings. In all the drawings for explaining the embodiments, members having the same functions are identified by the same reference numerals and repeated explanations thereof will be omitted. In the following embodiments, explanations of the same or similar portions will not be repeated in principle except when such repeated explanations are particularly necessary. Further, in the drawings for explaining the embodiments, even plan views may be hatched to facilitate understanding of the illustrated configurations.

First Embodiment

This embodiment is an application of the present invention to the manufacture of a CSP which is a kind of a surface mount type semiconductor package. FIG. 1 is an entire flow chart showing a manufacturing process for the CSP.

One feature of this manufacturing process resides in that, in order to greatly shorten the post-process and implement a CSP (RCSP: Real Chip Size Package) of substantially the same size as a semiconductor chip, re-wiring lines are provided using Al (aluminum) or Cu (copper) over existing wiring lines on a semiconductor wafer (hereinafter referred to simply as "wafer") with semiconductor chips arranged in plural rows and plural columns, and a plurality of external coupling terminals (solder balls) are coupled electrically onto the re-wiring lines and are arranged on the wafer.

For fabricating the CSP formed in the above manner, first a semiconductor wafer formed by single crystal silicon is provided and elements such as MOSFETs are formed on a main surface (an integrated circuit-forming surface) of the semiconductor wafer, thereafter wiring lines for coupling between the elements are formed. Subsequently, a passivation film (a surface protecting film), which is, for example, a silicon oxide film or a silicon nitride film, is formed on top of the wiring lines and is then etched to expose a part of the wiring lines, thereby forming electrode pads. The above elements, wiring lines and electrode pads are formed by combining, for example, known photolithography technique, CVD technique, sputtering technique and etching technique. Therefore, detailed explanations about their manufacturing processes will here be omitted.

Figure 2:
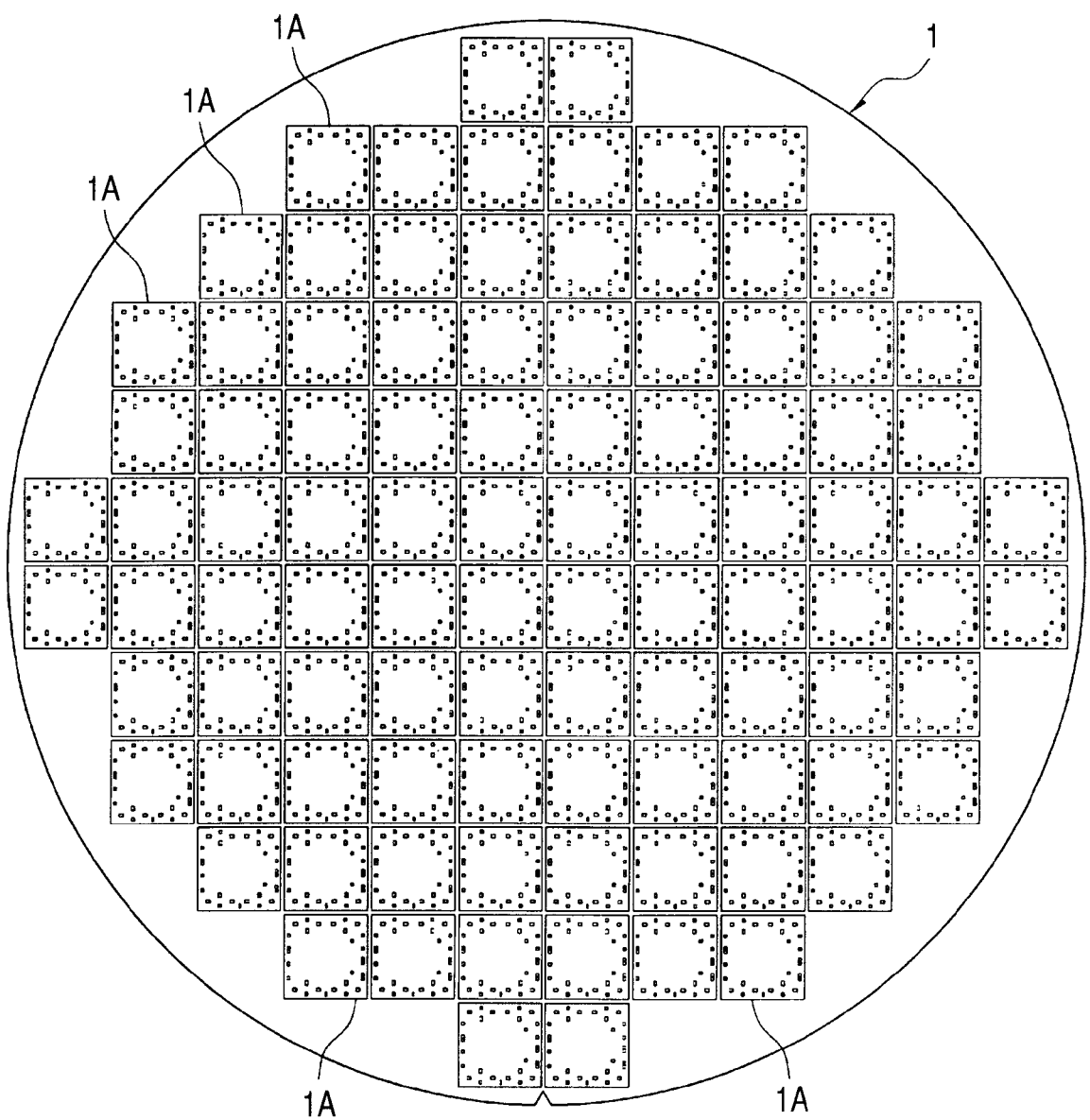
FIG. 2 is an entire plan view of a semiconductor wafer in a state in which the formation of electrode pads is over.
Figure 3:
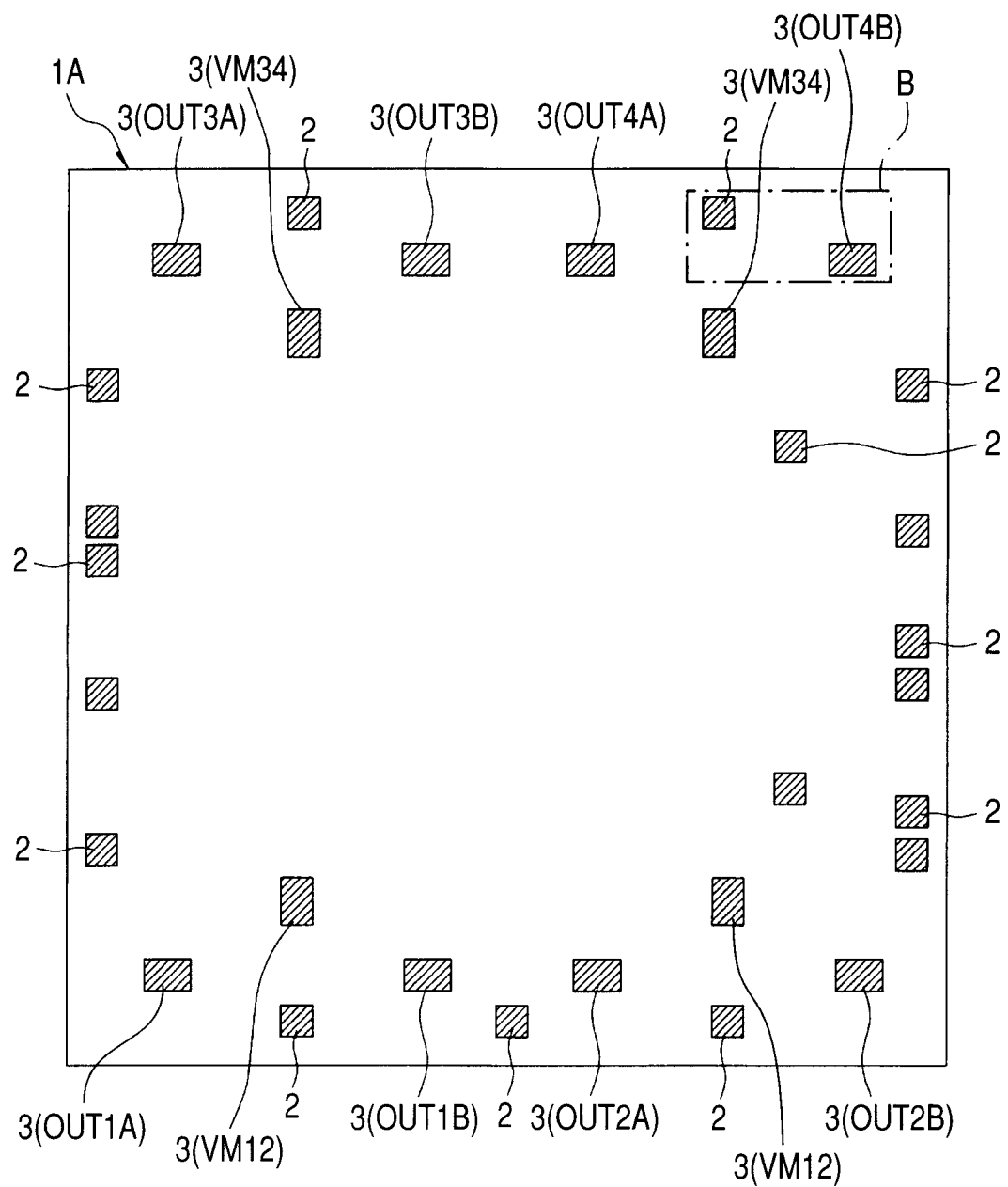
FIG. 3 is an enlarged plan view of one chip area within the semiconductor wafer shown in FIG. 2.
Figure 4:
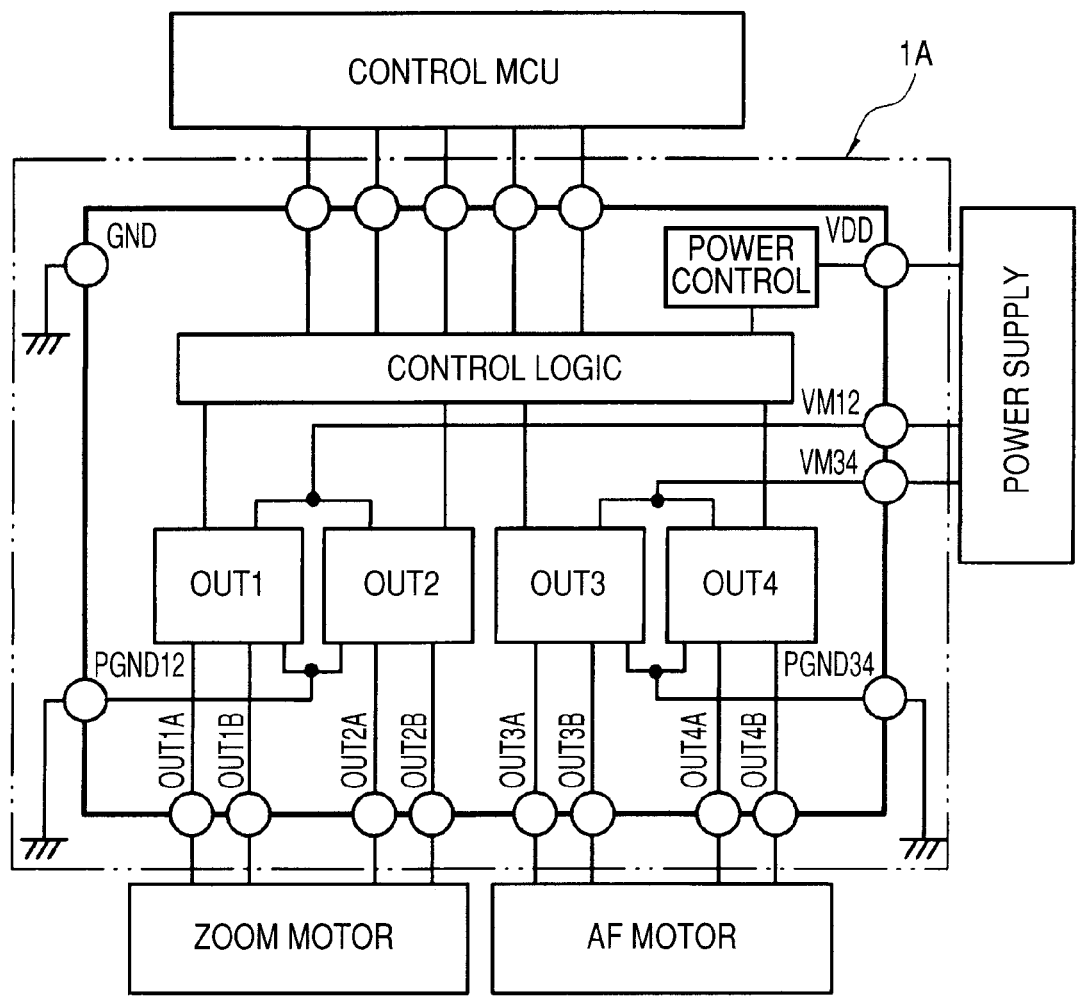
FIG. 4 is a functional block diagram of a motor driver circuit formed in the chip area shown in FIG. 3.

FIG. 2 is an entire plan view of a wafer in a state in which the formation of electrode pads is over, FIG. 3 is an enlarged plan view of one chip area (an area which becomes one semiconductor chip upon dicing of the wafer) within the wafer shown in FIG. 2, FIG. 4 is a functional block diagram of a circuit formed in the chip area shown in FIG. 3, and FIG. 5 is a layout diagram of functional blocks shown in FIG. 4.

A main surface of the wafer 1 is divided into a plurality of chip areas 1A and a motor driver circuit for driving, for example, a lens controlling motor for a DSC (Digital Still Camera) is formed in each chip area 1A. As shown in FIG. 4, the motor driver circuit includes a control logic circuit, a power control circuit, and output stages (OUT1 to OUT4).

Further, there are provided a power control circuit coupled electrically to output stages (OUT1 to OUT2) and a power control circuit coupled electrically to output stages (OUT3 to OUT4). The control logic circuit is disposed at a position sandwiched in between those power control circuits.

As shown in FIG. 3, on a surface of each chip area 1A are formed a plurality of electrode pads 2 and 3 which configure power terminals, GND terminals and signal terminals of the motor driver circuit. In the illustrated example, the number of electrode pads 2 and 3 formed in each chip area 1A is 30 for example. The electrode pads 2 and 3 are formed using a known wiring material, e.g., aluminum (Al) alloy.

Of the thirty electrode pads 2 and 3 shown in FIG. 3, twelve electrode pads 3 which configure power terminals and output terminals in the output stages (OUT1 to OUT4) are denoted by reference marks corresponding to the functional block diagram of FIG. 4. That is, electrode pads 3 (VM12) are power terminals in output stages (OUT1, OUT2) and electrode pads 3 (VM 34) are power terminals in output stages (OUT3, OUT4). Likewise, electrode pads 3 (OUT1A, OUT2A, OUT2B, OUT3A, OUT3B, OUT4A, OUT4B) are output terminals in output stages (OUT1 to OUT4). The remaining eighteen electrode pads 2 each configure any of GND terminals (PGND12, PGND34) in output stages (OUT1 to OUT4) and power terminals (VDD, VCC), GND terminals and signal terminals in other circuits than the output stages (OUT1 to OUT4).

The area of each of the twelve electrode pads 3 which configure power terminals and output terminals in the output stages (OUT1 to OUT4) shown in FIG. 4, out of the thirty electrode pads 2 and 3 formed on the surface of each chip area A, is smaller than twice the area of each electrode pad 2. That is, given that the area of each of the twelve electrode pads which configure power terminals and output terminals in the output stages (OUT1 to OUT4) is B and the area of each of the remaining eighteen electrode pads 2 is A, there exists a relation of A=B<2A.

Figure 6A:
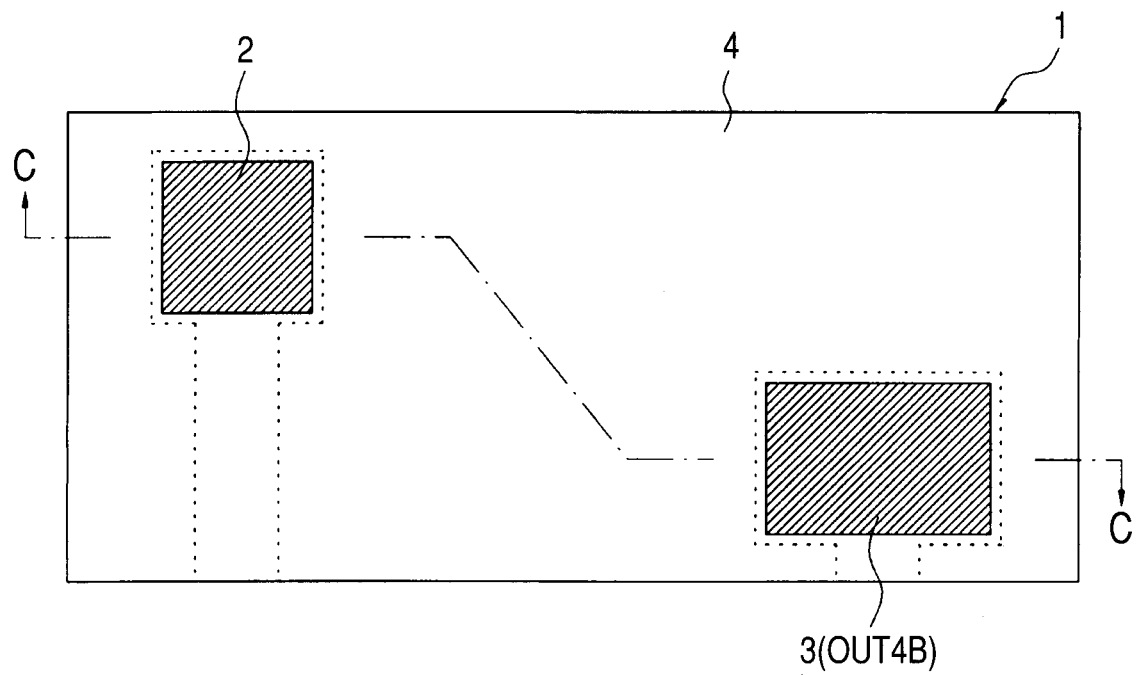
FIG. 6A is an enlarged plan view of a rectangular area enclosed with a dot-dash line (B) in FIG. 3
Figure 6B:
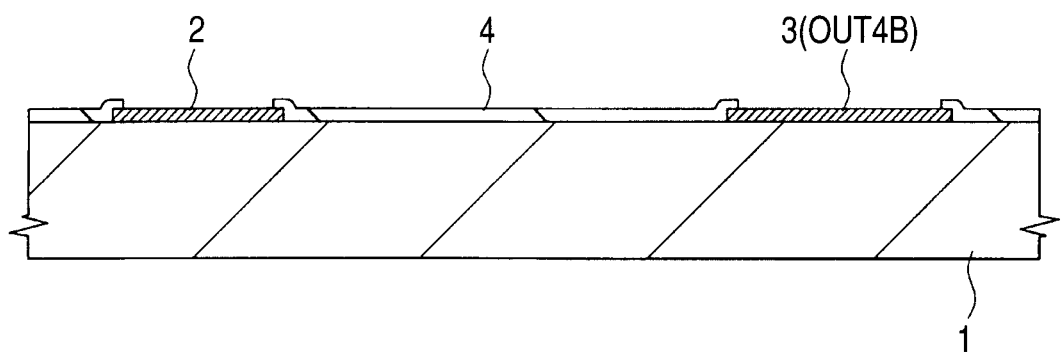
FIG. 6B is a sectional view of the semiconductor wafer taken along line C-C in FIG. 6A.

FIG. 6A is an enlarged plan view of the area enclosed by a rectangular dot-dash line (B) in FIG. 3 and FIG. 6B is a sectional view of the wafer 1 taken along line C-C in FIG. 6A. A portion of elements and wiring lines which configure the motor driver circuit are formed in the area, but only the electrode pads 2 and 3 are shown in FIG. 6B and wiring lines and elements are not shown.

In the area shown in FIG. 6 of the chip area 1A there are formed one electrode pad 2 and one electrode pad 3 having been formed by etching a part of a passivation film 4 which covers a top surface of the wafer 1. Of the two electrode pads 2 and 3, the electrode pad 2 disposed on the left side of FIG. 6A, which pad is square in shape, configures, for example, a GND terminal in output stages (OUT1, OUT2) shown in FIG. 4. Further, the electrode pad 3 disposed on the right side of FIG. 6A, which pad is rectangular in shape, is an electrode pad (VM34) which configures, for example, a power terminal in output stages (OUT3, OUT4) shown in FIG. 4.

Of the above two electrode pads 2 and 3, the square electrode pad 2 has a one-side dimension of, say, 86 μm. However, outer periphery portions of the electrode pads 2 and 3 are covered with the passivation film 4 to prevent penetration of foreign matters such as water into the interior of the wafer 1. Therefore, one-side dimension of the electrode pad 2 actually exposed to the surface of the wafer 1 is 78 μm. On the other hand, the dimension of the rectangular electrode pad 3 (the dimension of the area exposed actually to the surface of the wafer 1) is, for example, short side×long side=78 μm×125 μm.

A description will now be given about an electrical characteristics testing method for the motor driver circuit formed in each chip area 1A of the wafer 1. This electrical characteristics testing method involves contacting probes with the electrode pads 2 and 3 formed in each chip area 1A of the wafer 1 to check, chip area 1A by chip area 1A, whether the constituent elements of the motor driver circuit are good or bad and in what state wiring lines are with respect to continuity and non-continuity.

Generally, a large current for driving a motor flows in the motor driver circuit and therefore power MOSFETs high in switching speed and having an on resistance as low as 1 O or less are used as the elements which configure the output stages (OUT1 to OUT4). Therefore, as the electrical characteristics testing method for the motor driver circuit there in many cases is adopted a Kelvin contact method (four-terminal measuring method) in order to measure the on resistance of the power MOSFETs for the output stages.

As noted above, the area of each of the electrode pads 3 as power terminals and output terminals is smaller than twice the area of each electrode pad 2. That is, the area (B) of each power terminal (electrode pad 3) and the area (B) of each output terminal (electrode pad 3), in the output stages of the motor driver circuit described above, are each smaller than twice the area (A) of each two-terminal measuring electrode pad 2, (A=B<2A).

With such a structure, the occupying area of electrode pads on the chip surface can be made smaller than arranging two electrode pads for Kelvin contact which are each equal in area to each electrode pad 2. To be more specific, the space between electrode pads which is formed when two electrode pads are arranged side by side, as well as the portions (portions overlapping the environs of the electrode pads) of the passivation film lying in the space which portions cover the environs of the electrode pads respectively, are no longer existent, and hence the chip surface occupying area can be so much reduced in comparison with the case where two electrode pads are arranged side by side.

Moreover, it is no longer necessary to provide two electrode pads 2 for Kelvin contact and one electrode pad suffices, so that even when it is difficult in point of layout to dispose two electrode pads on the chip surface, it is possible to solve this problem. Further, since it becomes possible for two probes to stand on one electrode pad 3, Kelvin contact can be done on one electrode pad even without arranging two electrode pads side by side.

The structure of making the area of each electrode pad 3 smaller than twice the area of each electrode pad 2 may be applied to both power terminals and output terminals or to either of the two. Limitation is made to neither the application to both nor the application to all the terminals in one of the two. In the case where the structure in question is applied to all the electrode pads of both power terminals and output terminals, the occupying area of the electrode pads on the chip surface can be made smallest.

Figure 7A:
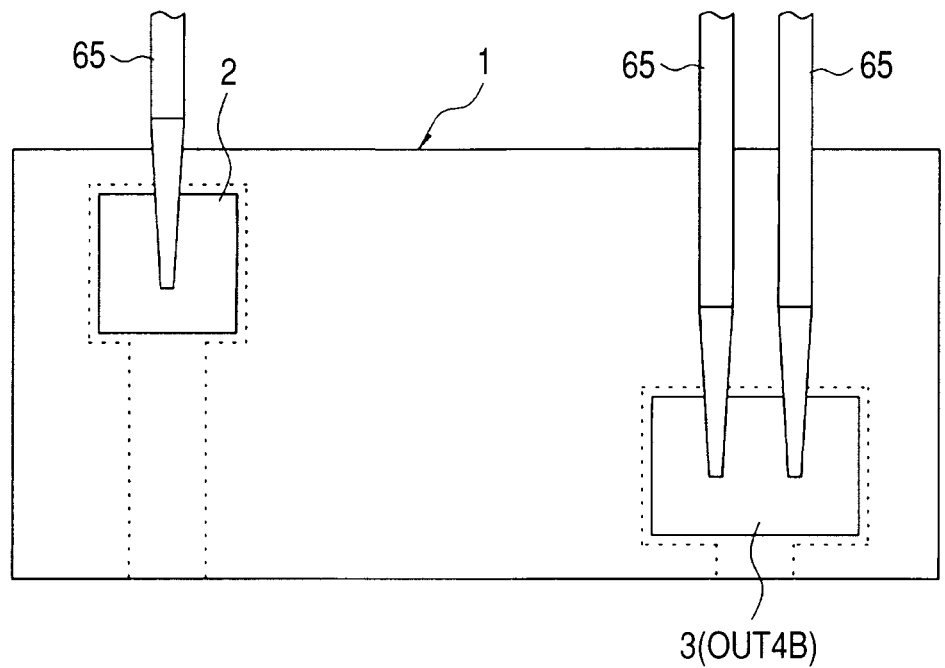
FIG. 7A is a plan view showing a method wherein two cantilever type probes are arranged side by side and Kelvin contact is performed for an electrode pad and FIG. 7B is a plan view showing an example of probe traces formed on surfaces of electrode pads after performing Kelvin contact in FIG. 7A.

FIG. 7A is a diagram in which two cantilever type probes 65 are arranged side by side and in this state there is performed Kelvin contact for an electrode pad 3. It is technically possible to let the spacing (pitch) between the tips of the cantilever type probes 65 approach each other up to a degree of, say, 110 μm or so. Therefore, if the dimension of the electrode pad 3 is the foregoing short side×long side=78 μm×125 μm or so, then, even without using a new probe structure, it is possible to fully effect Kelvin contact at the present probe pitch (fabrication) level for one electrode pad.

Figure 7B:
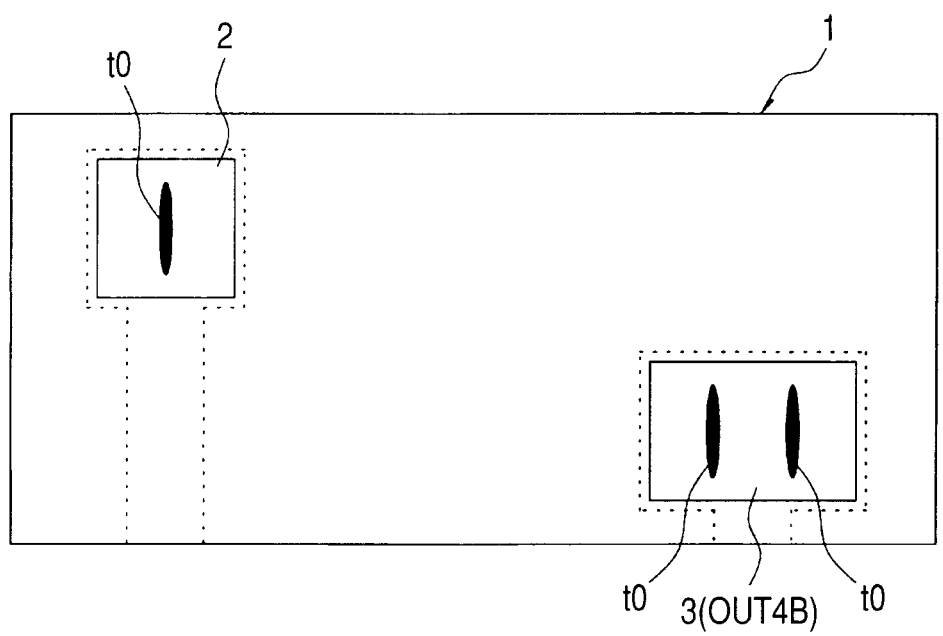

At this time, the surface oxide film of the aluminum alloy film which configures the electrode pads 2 and 3 is removed to expose a clean metal surface by wiping the cantilever type probes 65. FIG. 7B is a plan view showing an example of probe traces formed on the surfaces of the electrode pads 2 and 3 by the wiping. Probe traces ($t_0$) remaining on the surfaces of the electrode pads 2 and 3 are of the cantilever type probes 65. As a result of Kelvin contact, two traces ($t_0$) of a force-side probe and a sense-side probe remain on the surface of the electrode pad 3. The direction of the traces is not limited to the direction shown in FIG. 7B. As the case may be, traces appear in a lateral direction orthogonal to the direction of the traces in FIG. 7B or in an oblique direction. Also as to the trace length, there are both a case where it is longer than that shown in FIG. 7B and a case where it is shorter.

In the Kelvin contact method, when an electric current is supplied between power terminal (electrode pad 3) and output terminal (electrode pad 3) in each of the output stages (OUT1 to OUT4) through a pair of force-side probes, no electric current flows in the sense line separated from the force line. Therefore, in the voltmeter disposed in the sense line, a voltage drop caused by a contact resistance between the electrode pad 3 and the probe for Kelvin contact or by a line resistance of the tester is cancelled and only a voltage drop caused by the impedance in each of the output stages (OUT1 to OUT4) is measured, so that it is possible to measure an on resistance in each of the output stages (OUT1 to OUT4) with high accuracy.

Figure 10:
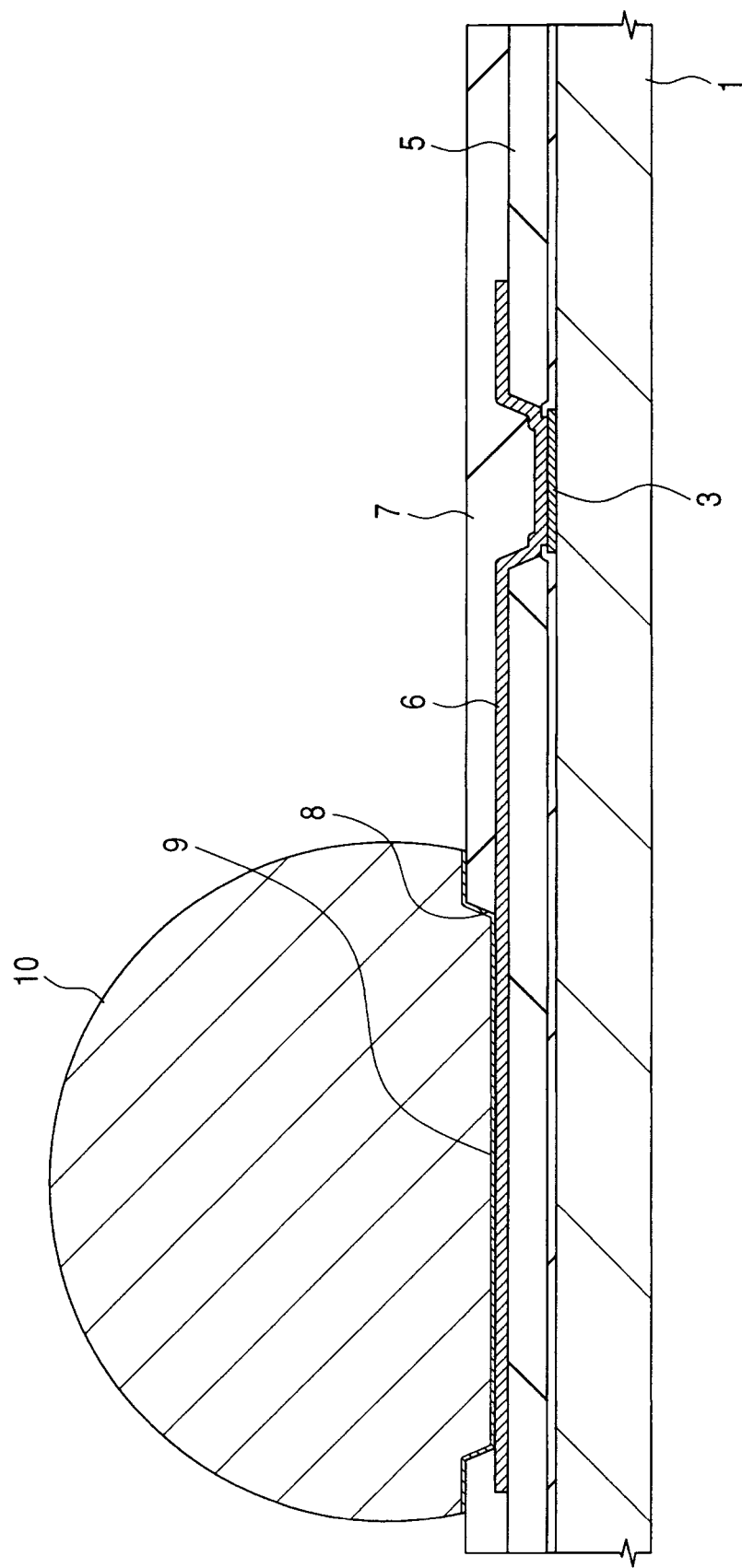
FIG. 10 is a sectional view of the principal portion of the semiconductor wafer, showing a semiconductor device manufacturing step which follows FIG. 9.

Next, the following description is provided about steps subsequent to the electrical characteristics test. First, as shown in FIG. 8, a polyimide resin film 5 is applied to the surface of the wafer 1 and thereafter the polyimide resin film 5 present on an electrode pad 3 is removed by etching to expose the electrode pad 3. Subsequently, a re-wiring line 6 is formed on the polyimide resin film 5 by electroplating or sputtering. The re-wiring line 6 is formed for example by a copper (Cu) film and one end thereof is coupled to the electrode pad 3 electrically. In FIG. 8 and FIGS. 9 and 10 to be referred to below, the re-wiring line 6 is coupled to one electrode pad 3, but actually the re-wiring line 6 is coupled to all the electrode pads 2 and 3 formed in each chip area 1A of the wafer 1.

Next, as shown in FIG. 9, a polyimide resin film 7 as a second layer is applied to the surface of the wafer 1 and thereafter a part of the polyimide resin film 7 is etched to form an aperture 8 on the re-wiring line 6.

Then, as shown in FIG. 10, a UBM (Under Bump Metal) layer 9 is formed on a surface of the re-wiring line 6 exposed to the bottom of the aperture 8 and thereafter a solder ball 10 is formed on the UBM layer 9, using for example tin (Sn)-silver (Ag)-copper (Cu) alloy.

Thereafter, the wafer 1 is diced chip area 1A by chip area 1A and semiconductor chips which were determined to be good in the foregoing electrical characteristics testing process are sorted out. Then, a final electrical characteristics test such as a burn-in test is conducted for the good semiconductor chips and semiconductor chips determined to be good in this final electrical characteristics test are sorted out, whereby the CSP of this embodiment is completed.

The steps subsequent to the above electrical characteristics test are applicable not only to this embodiment but also to the semiconductor devices of embodiments which follow.

Although this embodiment has been described above, what is to be mainly noted is that the on resistance can be measured with high accuracy in the pre-process without obstructing the reduction in size of the semiconductor chip and without complicating the design of the motor driver circuit.

Second Embodiment

In the above first embodiment a description has been given about performing Kelvin contact in a state in which the area of each of the electrode pads as power terminals and output terminals is made smaller than twice the area of each electrode pad 2 and in which the pitch of the existing cantilever type probes is made small.

In this second embodiment a description will be given about a probe technique (a probe structure) for further reducing the area of each electrode pad 3 (making closer to the area of each electrode pad 2). In the following description it is assumed that each of the twelve electrode pads 3 which configure power terminals and output terminals in the output stages (OUT1 to OUT4) has the same dimension (short side× long side=78 μm×125 μm) as each electrode pad (VM 34) and that each of the eighteen electrode pads 2 is in the shape of a square having a one-side dimension of 78 μm.

Figure 11:
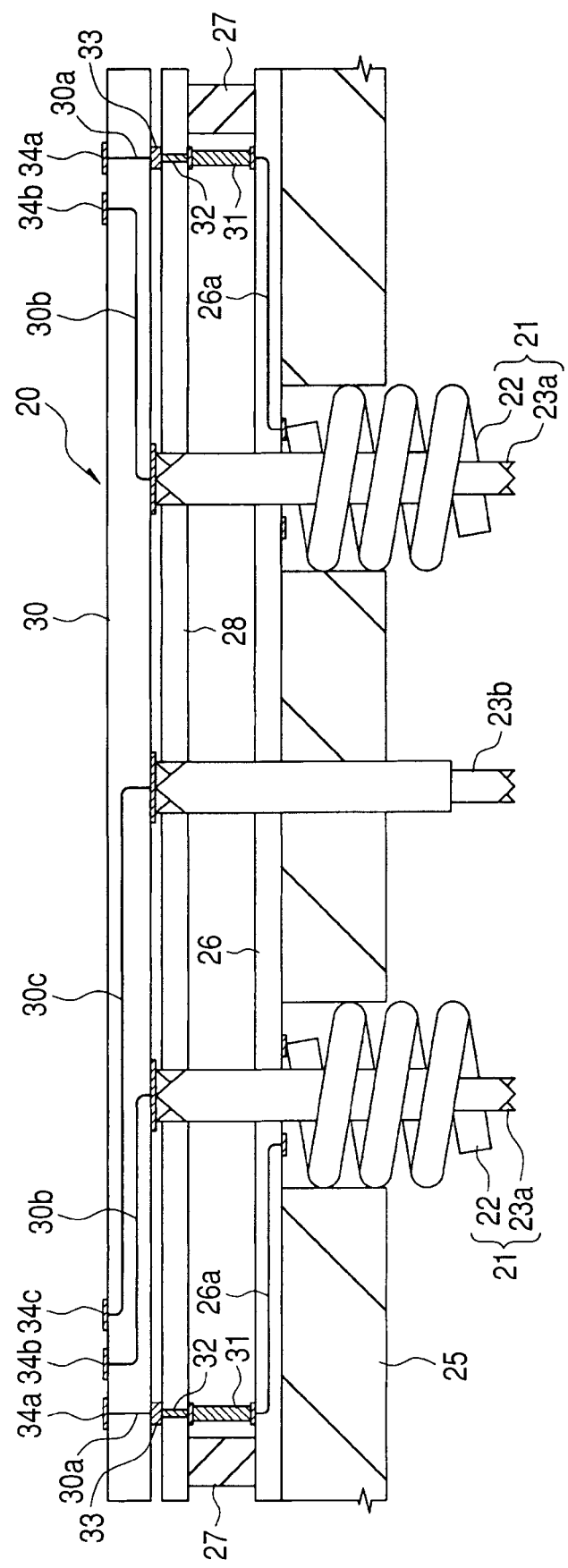
FIG. 11 is a schematic diagram of a principal portion, showing a probe card in a testing apparatus used in a second embodiment of the present invention.

FIG. 11 is a schematic diagram of a principal portion, showing a probe card 20 in a testing apparatus used in this embodiment. The testing apparatus has not only the probe card 20 but also a sample support system including for example a wafer stage for resting thereon an object to be tested. But the other constructional elements than the probe card 20 are substantially the same as known ones, so explanations and illustrations thereof are omitted.

As shown in FIG. 11, the probe card 20 in the testing apparatus includes a probe 21 for Kelvin contact, the probe 21 being comprised of a coil probe 22 and a POGO pin probe 23a disposed inside the coil probe 22, and a two-terminal measuring probe 23b, the two-terminal measuring probe 23b being configured by a POGO pin probe of the same structure as the POGO pin probe 23a.

When the testing apparatus is not in operation, a tip portion of the POGO pin probe 23a projects more downwards than a tip portion of the coil probe 22. The surface of the coil probe 22 or the surface of the POGO pin probe 23a disposed inside the probe 22 has a coating for insulation (not shown) except the tip portion which is for contact with each electrode pad 3 in order to prevent shorting between both probes 22 and 23a.

In FIG. 11 there are shown two probes 21 for Kelvin contact and one two-terminal measuring probe 23b, but the number of Kelvin contact probes 21 attached actually to the probe card 20 is twelve like the number of electrode pads 3 which configure power terminals and output terminals in the output stages (OUT1 to OUT4) of the motor driver circuit described above. Further, the number of the two-terminal measuring probes 23b is 18 like that of the electrode pads 2.

An upper half of the coil probe 22 in the Kelvin contact probe 21 is supported and fixed by a coil probe guide 25, while a lower half thereof projects downwards from the coil probe guide 25. A first wiring substrate 26 is mounted onto an upper surface of the coil probe guide 25 and the coil probe 22 is coupled electrically to a wiring line 26a in the first wiring substrate 26.

A second wiring substrate 28 is mounted above the first wiring substrate 26 through a spacer 27. The second wiring substrate 28 serves also as a guide for the POGO pin probes 23a and 23b. Upper end portions of the POGO pin probes 23a and 23b respectively are supported and fixed by the second wiring substrate 28. The POGO pin probes 23a and 23b each extend through the first wiring substrate 26 and the coil probe guide 25 and their lower end portions project downward from the coil probe guide 25.

A main substrate 30 is mounted above the second wiring substrate 28. The wiring line 26a in the first wiring substrate 26, which is coupled electrically to the coil probe 22, is coupled electrically to an electrode 34a on the main substrate 30 via conductive rubber 31 disposed between the first wiring substrate 26 and the second wiring substrate 28, a via hole 32 formed through the second wiring substrate 28, and pasty solder 33 which provides electrical coupling between a wiring line 30a in the main substrate 30 and the via hole 32.

Figure 24A:
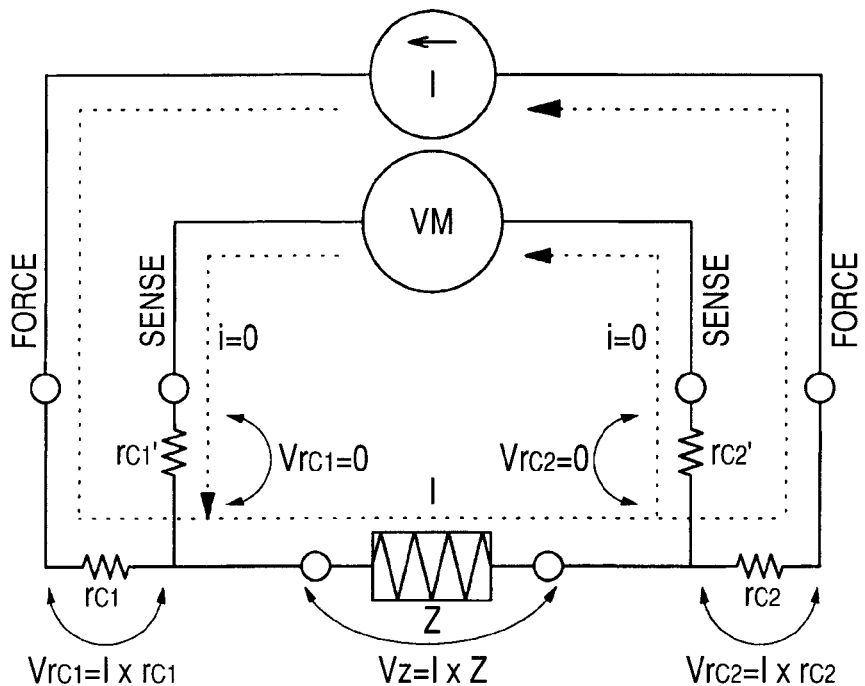
FIG. 24A is an equivalent circuit diagram of a tester, explaining the principles of the Kelvin contact method.
Figure 24B:
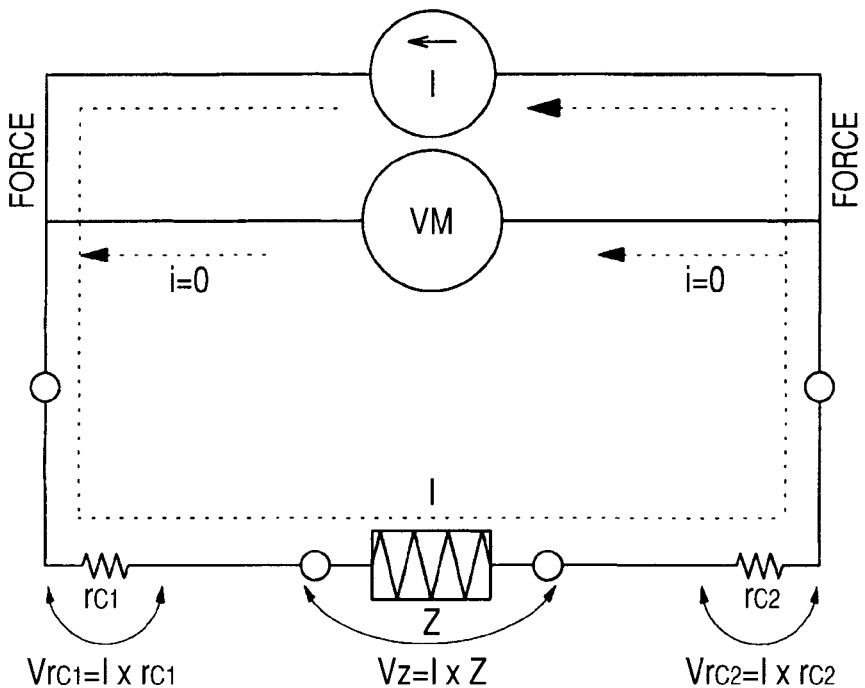
FIG. 24B is an equivalent circuit diagram of a tester, explaining the principles of the two-terminal measuring method.

The electrode 34a on the main substrate 30 is coupled to a sense line of a Kelvin contact tester (not shown) which has the same equivalent circuit as that shown in FIG. 24A. That is, the coil probe 22 in the Kelvin contact probe 21 configures a sense-side probe of the Kelvin contact tester. On the other hand, the POGO pin probe 23a in the Kelvin contact probe 21 is coupled electrically via a wiring line 30b in the main substrate 30 to an electrode 34b formed on the main substrate 30 and is further coupled to a force line of the Kelvin contact tester via the electrode 34b. That is, the POGO pin probe 23a configures the force-side probe of the Kelvin contact tester.

On the other hand, the two-terminal measuring probe 23b is coupled electrically via a wiring line 30c in the main substrate 30 to an electrode 34c formed on the main substrate 30 and is further coupled to a two-terminal measuring tester (not shown) via the electrode 34c.

Figure 12:
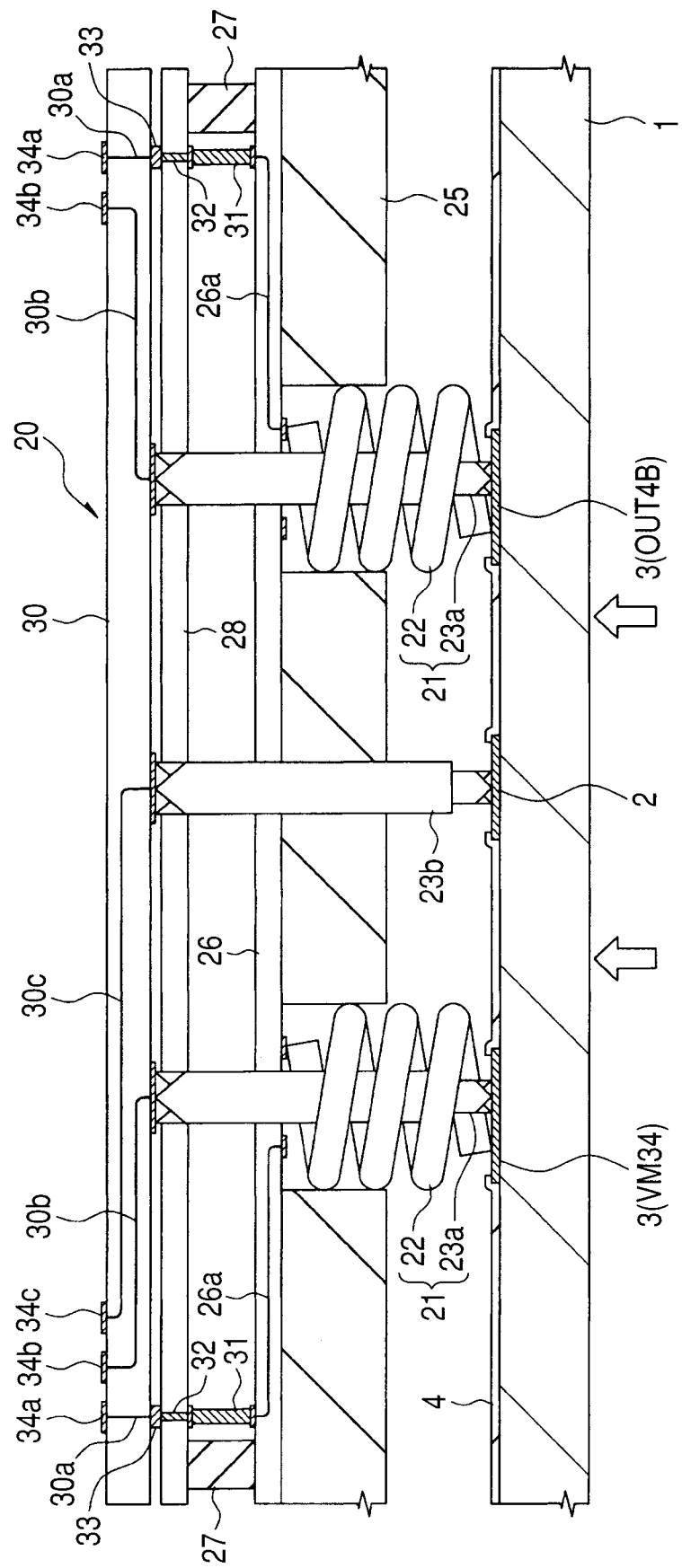
FIG. 12 is a diagram explanatory of an electrical characteristics testing method using the testing apparatus shown in FIG. 11.
Figure 13:
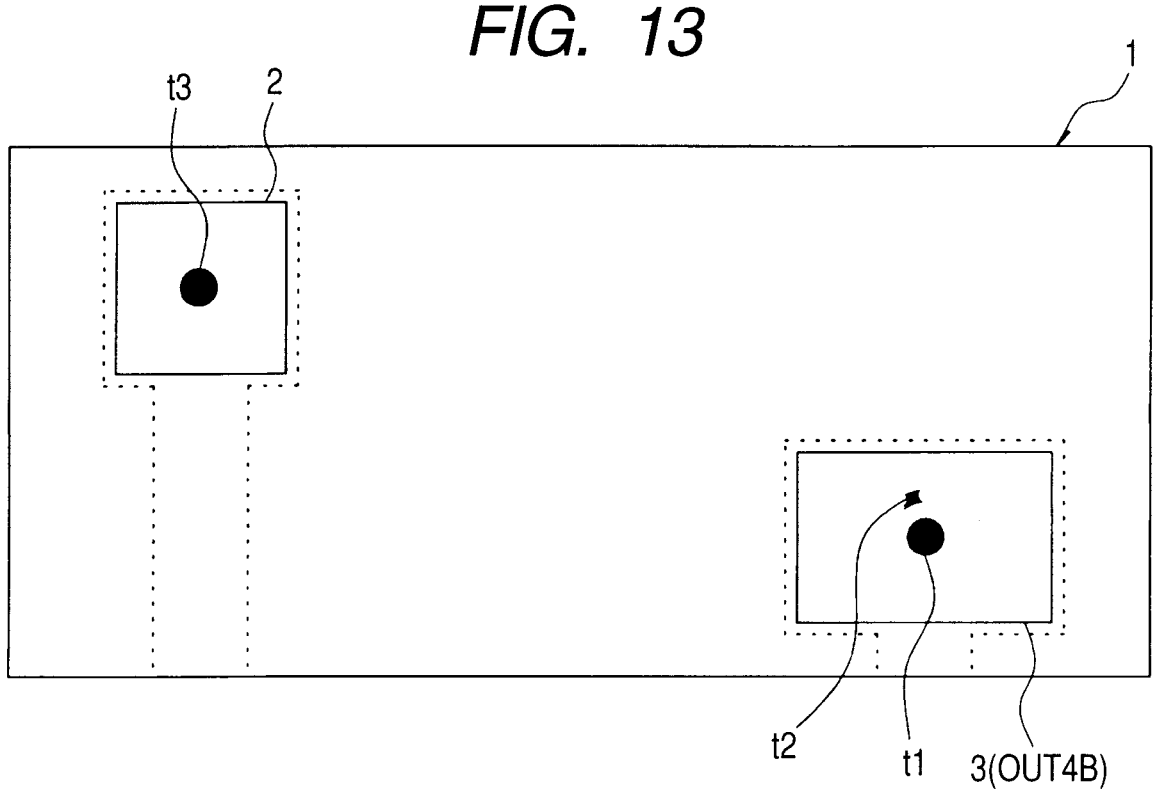
FIG. 13 is a plan view showing an example of probe traces formed on surfaces of electrode pads by probe wiping.

For performing an electrical characteristics test for the motor driver circuit with use of the above testing apparatus, first, as shown in FIG. 12, a wafer stage (not shown) which carries the wafer 1 thereon is raised, causing a lower end of each Kelvin contact probe 21 to come into contact with the surface of the associated electrode pad 3 and causing a lower end of each two-terminal measuring probe 23b to come into contact with the surface of the associated electrode pad 2. At this time, by wiping the Kelvin contact probe 21 and the two-terminal measuring probe 23b, the surface oxide film of the aluminum alloy film which configures the electrode pads 2 and 3 is removed, allowing a clean metal surface to be exposed. FIG. 13 is a plan view showing an example of traces formed on the surfaces of electrode pads 2 and 3 by the aforesaid wiping. A trace ($t_1$) remaining on the surface of the electrode pad 3 is of a POGO pin probe 23a, while a trace ($t_2$) is of a coil probe 22. Further, a trace ($t_3$) remaining on the surface of the electrode pad 2 is of a two-terminal measuring probe 23b.

Next, in a state in which the Kelvin contact probe 21 is in contact with the surface of each of the electrode pad 3 (OUT4B) and the electrode pad 3 (VM34) both shown in FIG. 12, an electric current is supplied to the output stage (OUT4) in the motor driver circuit and a voltage drop in this instant is measured by the Kelvin contact tester, thereby measuring an on resistance of the output stage (OUT4). In the same manner an electric current is supplied between the power terminal (electrode pad 3) and the output terminal (electrode pad 3) in each of the other output stages (OUT1 to OUT3) and a voltage drop in this instant is measured by the Kelvin contact tester, thereby measuring an on resistance in each of the output stages (OUT1 to OUT3). Further, using the two-terminal measuring probe 23b coupled to the electrode pad 2, there is performed a predetermined electrical characteristics test for the circuit coupled to the electrode pad 2.

In the Kelvin contact method, when an electric current is supplied between the power terminal (electrode pad 3) and the output terminal (electrode pad 3) in each of the output stages (OUT1 to OUT4) through a pair of force-side probes (POGO pin probes 23a), there flows no electric current in the sense line separated from the force line in question. Therefore, in the voltmeter disposed in the sense line, a voltage drop caused by a contact resistance between the electrode pad 3 and the Kelvin contact probe 21 and the tester line resistance are cancelled and only the voltage drop caused by the impedance in each of the output stages (OUT1 to OUT4) is measured, whereby the on resistance in each of the output stages (OUT1 to OUT4) can be measured with high accuracy.

In the manner described above the motor driver circuits formed in the chip areas 1A respectively of the wafer 1 are subjected in order to an electrical characteristics test (a predetermined electrical characteristics test including the measurement of an output stage on resistance), then on the basis of the results of the test it is determined whether each chip area 1A is good or bad.

Although in the above example the sense-side probe and the force-side probe in the Kelvin contact tester are configured by the coil probe 22 and the POGO pin probe 23a, respectively, this may be reversed, that is, the sense-side probe may be configured by the POGO pin probe 23a and the force-side probe may be configured by the coil probe 22. Moreover, although in the above example the two-terminal measuring probe 23b is configured by a POGO pin probe, it may be configured, for example, by a coil probe or a cantilever type probe.

Thus, in this embodiment, when measuring the on resistance of each output stage in the motor driver circuit in accordance with the Kelvin contact method, there is used the Kelvin contact probe 21 with the POGO pin probe 23a disposed inside the coil probe 22. The Kelvin contact probe 21 of such a structure permits shortening of the spacing between the force-side probe and the sense-side probe in comparison with the structure in which two cantilever probes are arranged side by side described in the first embodiment above for example. As a result, in comparison with the first embodiment it is possible to further reduce the area of each of the electrode pads 3 which are power terminals and output terminals (it is possible to make the area of each electrode pad 3 closer to the area of each electrode pad 2).

Third Embodiment

Figure 14A:
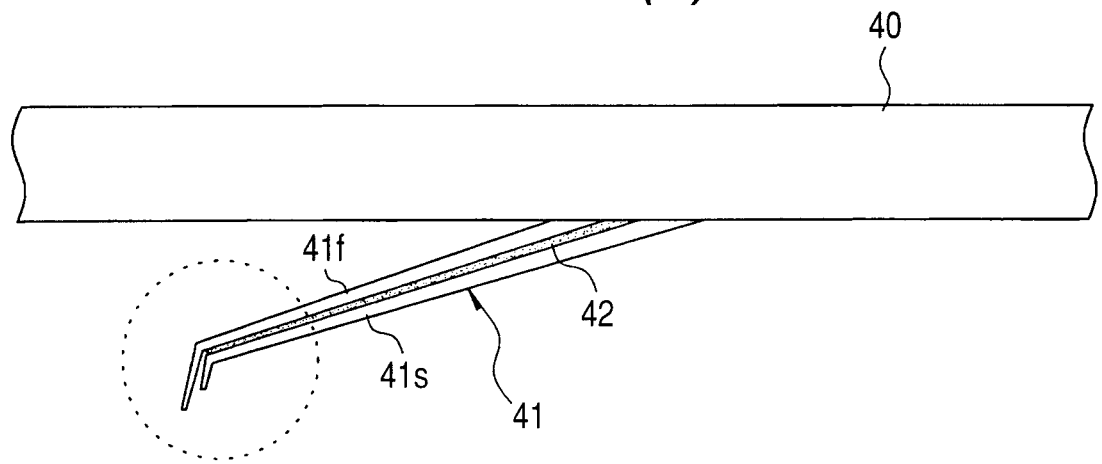
FIG. 14A is a side view showing a probe for Kelvin contact according to a third embodiment of the present invention and FIG. 14B is an enlarged diagram of a tip portion of the probe for Kelvin contact shown in FIG. 14A.
Figure 14B:
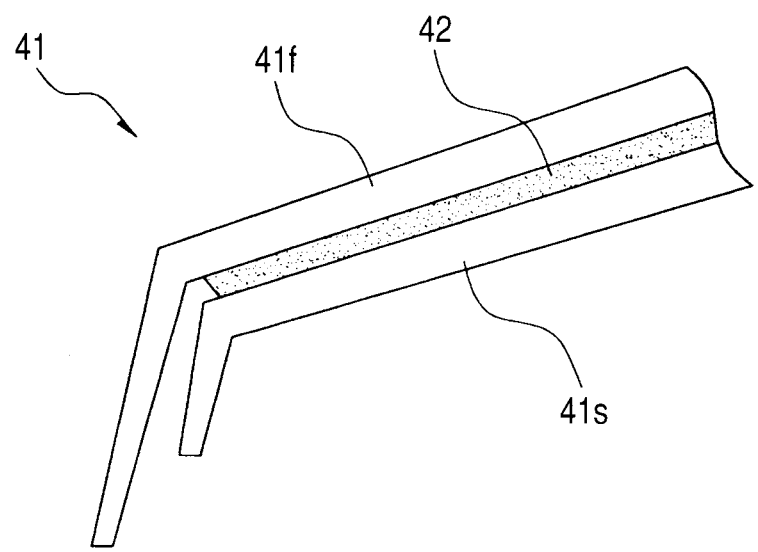

FIG. 14A is a side view of a probe for Kelvin contact according to this embodiment and FIG. 14B is an enlarged diagram of a tip portion of the probe for Kelvin contact.

A probe 41 for Kelvin contact according to this embodiment includes a force-side probe 41f and a sense-side probe 41s both extending obliquely downward from a lower surface of a probe card 40. A feature of the Kelvin contact probe 41 resides in that the force-side probe 41f is stacked on the sense-side probe 41s through a thin filmy insulating sheet 42. The force-side probe 41f and the sense-side probe 41s are cantilever type probes formed of a metallic material such as tungsten, each having a tip diameter of about 25 μm.

A tip length of the force-side probe 41f and that of the sense-side probe 41s are different from each other. More specifically, the tip portion of the force-side probe 41f disposed over the insulating sheet 42 is longer than that of the sense-side probe 41s disposed under the insulating sheet 42. Therefore, when the testing apparatus is not in operation, the tip portion of the force-side probe 41f is positioned lower than the tip portion of the sense-side probe 41s.

The number of Kelvin contact probes 41 attached to the lower surface of the probe card 40 is twelve which is the same as the number of the electrode pads 3 (power terminals and output terminals in the output stages of the motor driver circuit) formed in each chip area 1A of the wafer 1. Though not shown, eighteen probes for two-terminal measurement, which number is the same as the number of the electrode pads 2 formed in the chip area 1A, are also attached to the lower surface of the probe card 40. The two-terminal measuring probes are comprised of, for example, cantilever type probes.

Figure 15:
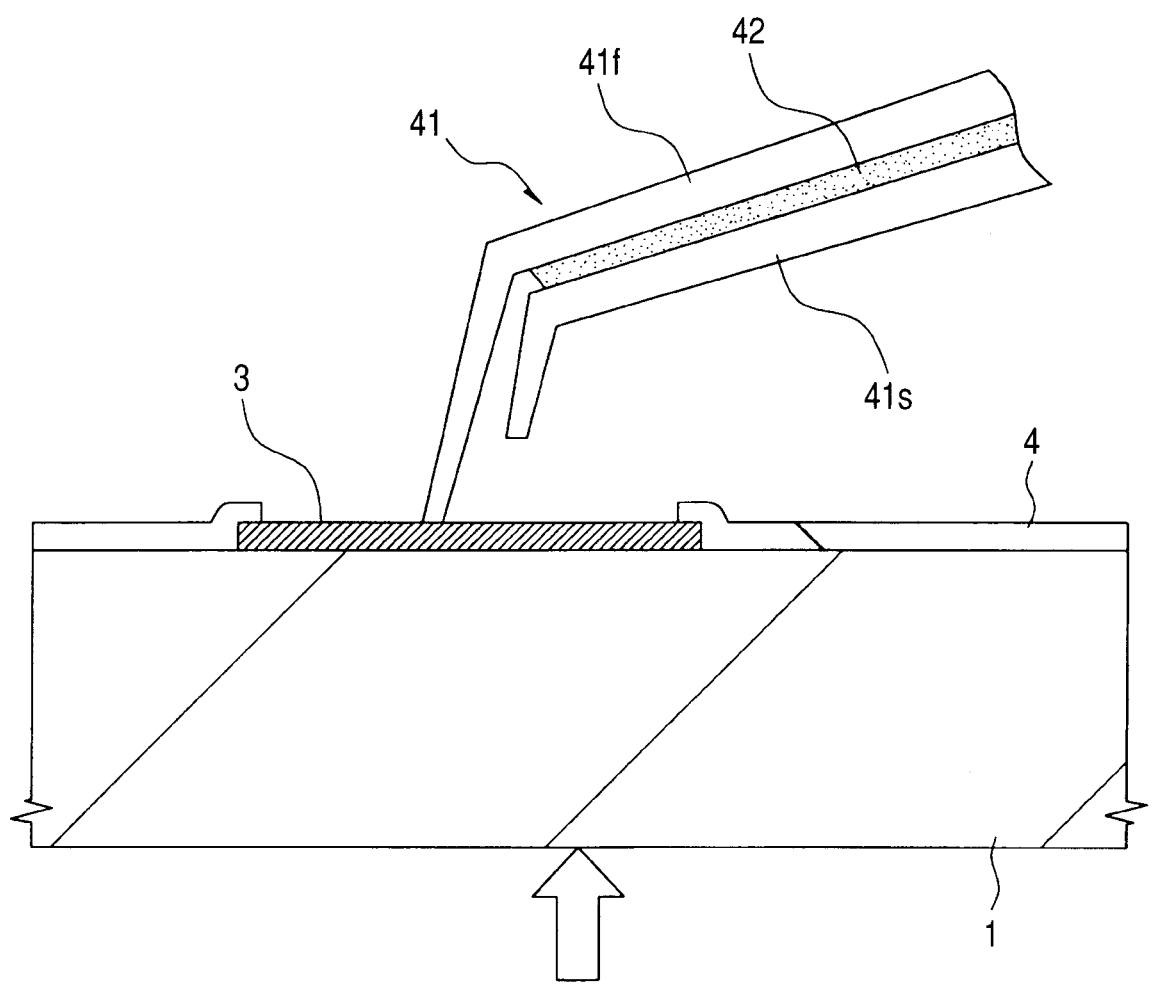
FIG. 15 is a sectional view of a principal portion of a semiconductor wafer, showing an electrical characteristics testing method using the probe for Kelvin contact shown in FIG. 14.

For performing an electrical characteristics test for the motor driver circuit formed in each chip area 1A, first, as shown in FIG. 15, the wafer 1 is raised, causing a lower end of the Kelvin contact probe 41 to come into contact with the surface of the electrode pad 3. As noted above, since the tip portion of the force-side probe 41f is positioned lower than the tip portion of the sense-side probe 41s, the tip portion of the force-side probe 41f first comes into contact with the surface of the electrode pad 3 with the rising motion of the wafer 1.

Figure 16:
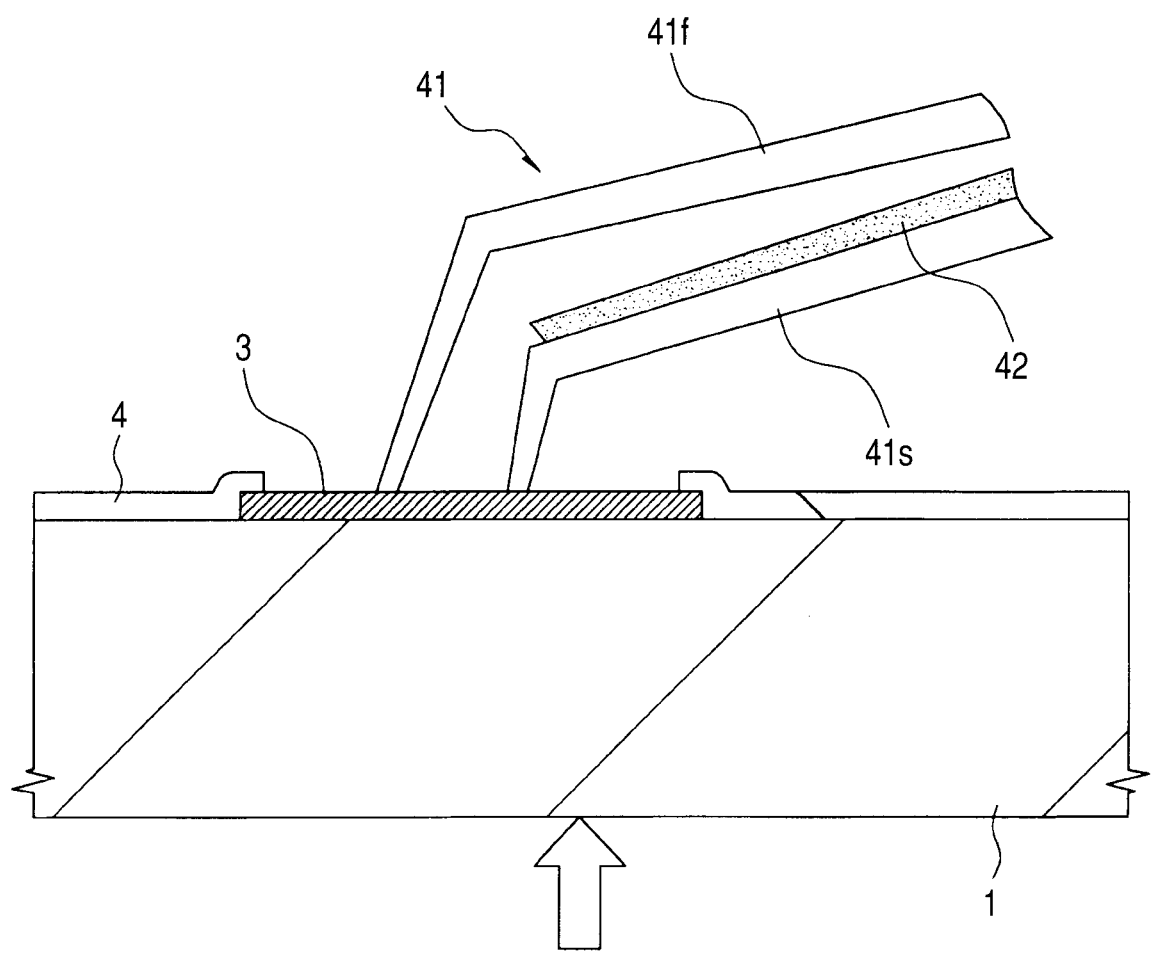
FIG. 16 is a sectional view of the principal portion of the semiconductor wafer, showing the electrical characteristics testing method using the probe for Kelvin contact shown in FIG. 14.

Subsequently, as the wafer 1 is further raised, the tip portion of the sense-side probe 41s also comes into contact with the surface of the electrode pad 3, as shown in FIG. 16. At this time, the force-side probe 41f performs a wiping motion on the surface of the electrode pad 3 to remove the surface oxide film and comes into conduction with the electrode pad 3, thus making it possible to measure the on resistance in each output stage. Since there flows no electric current in the sense line with the sense-side probe 41s coupled thereto, even if a thin surface oxide film remains between the sense-side probe 41s and the electrode pad 3, it does not provide any obstacle.

Figure 17A:
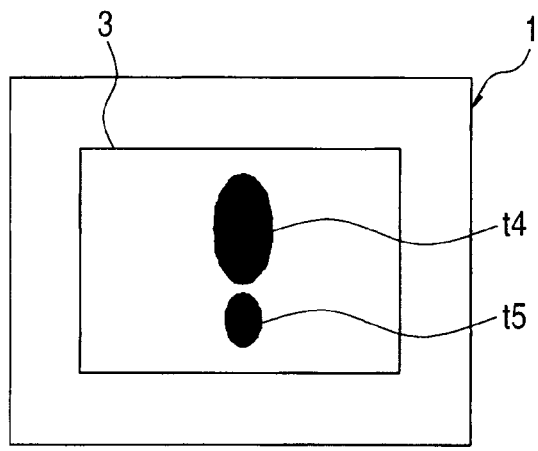
FIGS. 17A, 17B and 17C are plan views each showing an example of probe traces formed on an electrode pad surface by wiping of the probe for Kelvin contact.
Figure 17B:
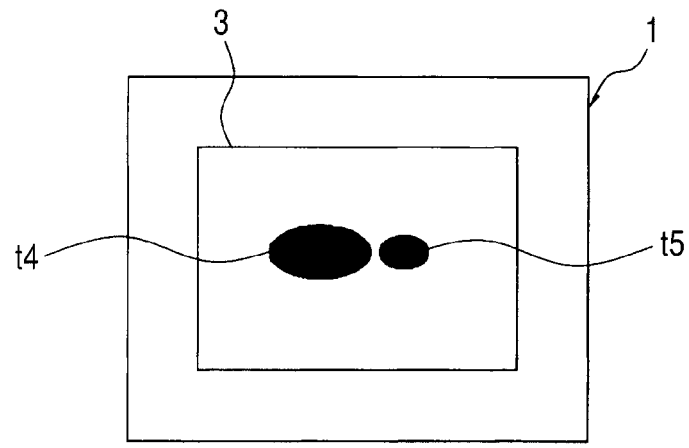
Figure 17C:
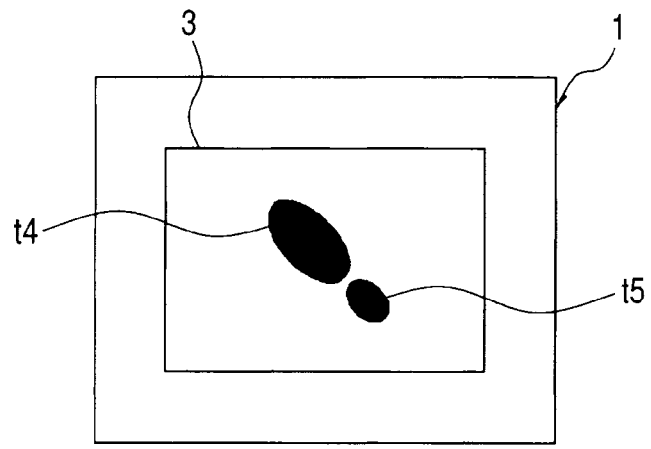

FIGS. 17A, 17B and 17C are plan views each showing an example of traces formed on the surface of an electrode pad 3 by wiping of the probe 41 for Kelvin contact, of which FIG. 17A shows traces formed when the extending direction of the Kelvin contact probe 41 is parallel to short sides of the electrode pad 3, FIG. 17B shows traces formed when the extending direction of the Kelvin contact probe 41 is parallel to long sides of the electrode pad 3, and FIG. 17C shows traces formed when the Kelvin contact probe 41 extends obliquely with respect to both short and long sides of the electrode pads 3. In FIGS. 17A to 17C, a trace ($t_4$) is of the force-side probe 41f and a trace ($t_5$) is of the sense-side probe 41s. Since the force-side probe 41f is larger in the amount of wiping on the surface of the electrode pad 3 than the sense-side probe 41s, its trace ($t_4$) is in many cases longer than the trace ($t_5$) of the sense-side probe 41s.

Thus, the probe 41 for Kelvin contact according to this embodiment is of a stacked structure of the force-side probe 41f on top of the sense-side probe 41s, so it is possible to shorten a lateral spacing between the force-side probe 41f and the sense-side probe 41s in comparison with the lateral juxtaposed arrangement of cantilever type probes described in the first embodiment. As a result, in comparison with the first embodiment it is possible to further reduce the area of each of the electrode pads 3 which are power terminals and output terminals (it is possible to make the area of each electrode pad 3 closer to the area of each electrode pad 2).

Although in the above example the force-side probe 41f and the sense-side probe 41s are insulated from each other through the insulating sheet 42, for example a gap may be formed between the probes 41f and 41s to insulate the two from each other.

Although in the above example the force-side probe 41f is disposed on top of the sense-side probe 41s, this arrangement may be reversed, that is, the sense-side probe 41s may be disposed on top of the force-side probe 41f. In this case, the tip portion of the sense-side probe 41s is set longer than that of the force-side probe 41f. In this case, moreover, it is necessary to give consideration so that the surface oxide film may not remain between the force-side probe 41f and the electrode pad 3 between which an electric current flows.

Fourth Embodiment

Figure 18A:
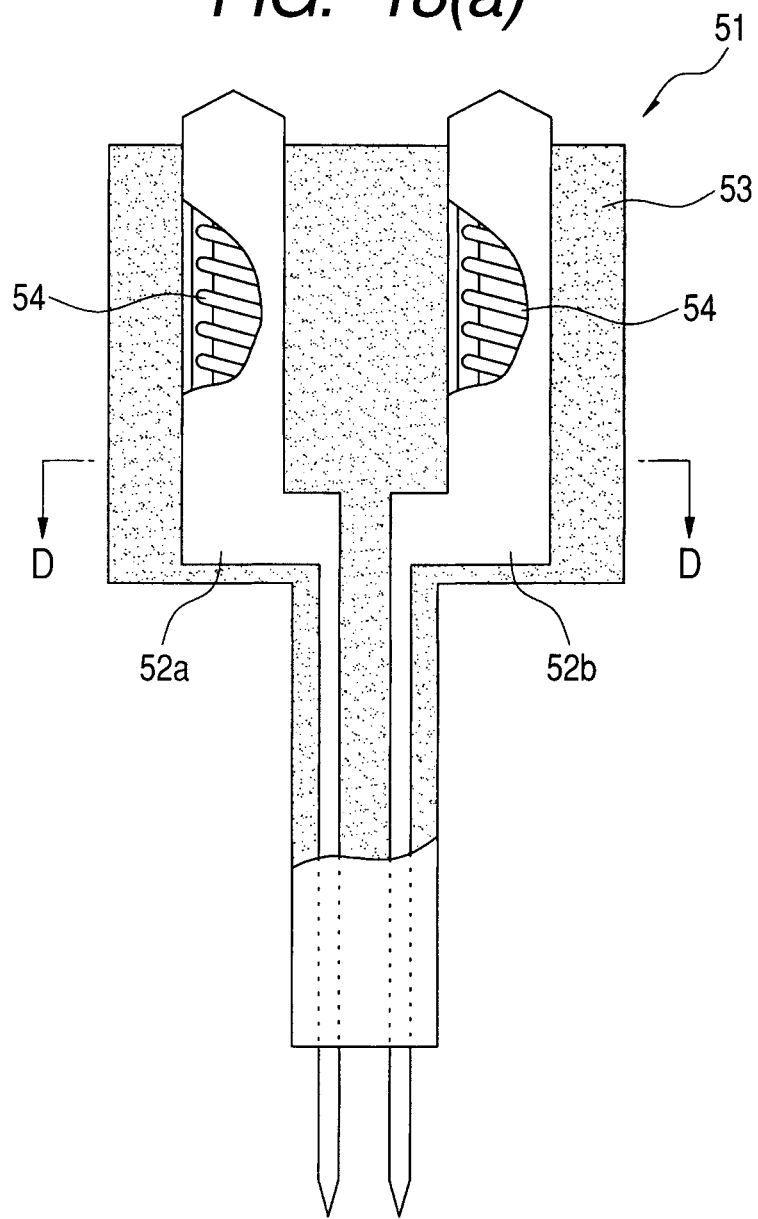
FIG. 18A is a cut-away sectional view of a principal portion, showing an example of a probe for Kelvin contact according to a fourth embodiment of the present invention
Figure 18B:
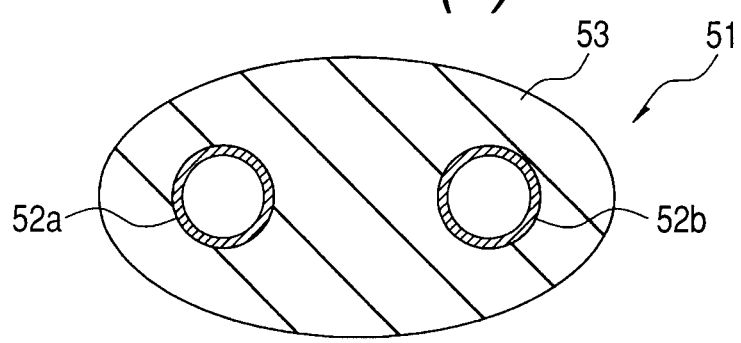
FIG. 18B is a sectional view taken along line D-D in FIG. 18A.

FIGS. 18A and 18B are sectional views, of which FIG. 18A is a cutaway sectional view of a principal portion, showing a probe for Kelvin contact according to this embodiment and FIG. 18B is a sectional view taken along line D-D in FIG. 18A.

A probe 51 for Kelvin contact according to this embodiment includes two POGO pin probes 52a and 52b both having the same shape and structure. One of the two POGO pin probes 52a and 52b is a force-side probe and the other is a sense-side probe. The two POGO pin probes 52a and 52b are accommodated within an insulating tube 53 except their tip portions and are insulated from each other.

A lower half of each of the two POGO pin probes 52a and 52b is smaller in diameter than an upper half thereof in which a coil spring 54 accommodated. The POGO pin probes 52a and 52b are bent in a crank shape at respective intermediate portions so that their tip portions are close to each other. The spacing between the tip portion of the POGO pin probe 52a and that of the POGO pin probe 52b is, say, 20 μm or so.

In the Kelvin contact probe 51 of this embodiment, because of the structure described above, the spacing between the tip portion of the force-side probe and that of the sense-side probe can be made narrower than for example in the laterally juxtaposed structure of two cantilever type probes described in the first embodiment. As a result, the area of each of the electrode pads 3 which are power terminals and output terminals can be further reduced (can be made closer to the area of each electrode pad 2).

Figure 19A:
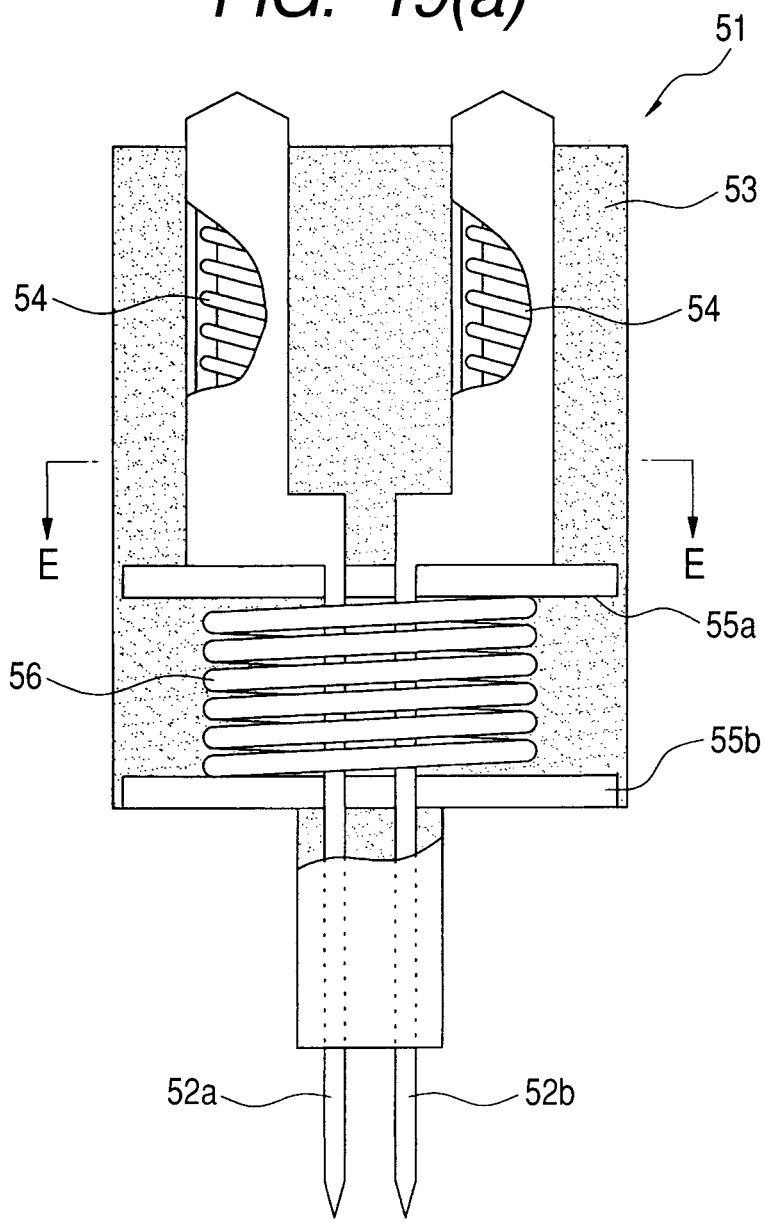
FIG. 19A is a cut-away sectional view of a principal portion, showing another example of a probe for Kelvin contact according to the fourth embodiment
Figure 19B:
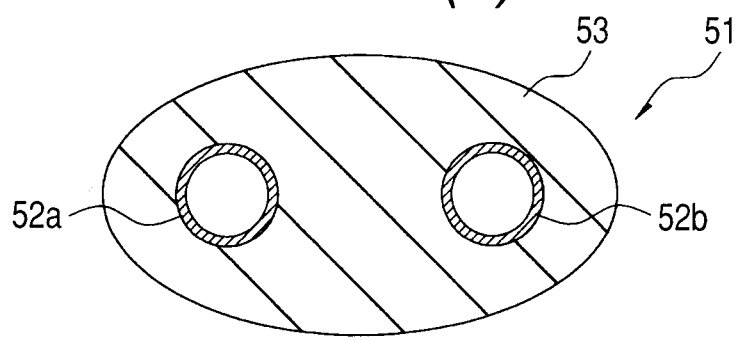
FIG. 19B is a sectional view taken along line E-E in FIG. 19A.
Figure 20A:
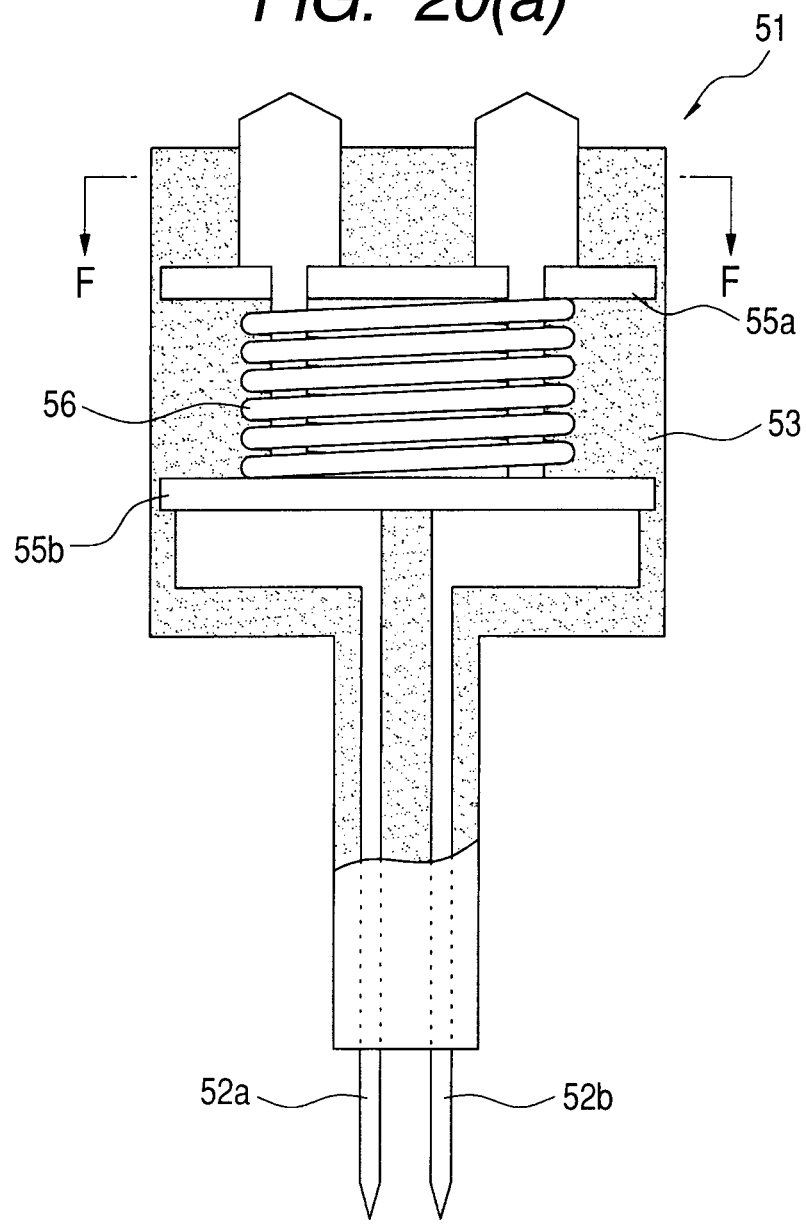
FIG. 20A is a cut-away sectional view of a principal portion, showing a further example of a probe for Kelvin contact according to the fourth embodiment
Figure 20B:
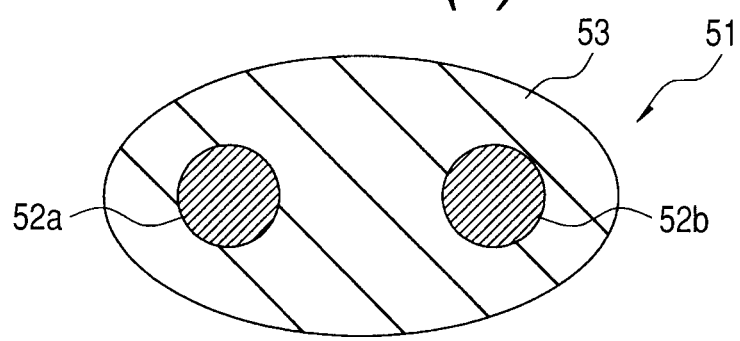
FIG. 20B is a sectional view taken along line F-F in FIG. 20A.

In the Kelvin contact probe 51 of this embodiment, its minute structural details can be changed variously. For example, there may be adopted such a structure as shown in FIG. 19, in which a coil spring 56 is accommodated between a pair of partition plates 55a and 55b disposed at intermediate positions of the POGO pin probes 52a and 52b and the probes 52a and 52b are pushed against the surface of the electrode pad 3 with the biasing force of the coil spring 56. In the case of using the coil spring 56, the coil springs 54 accommodated in the POGO pin probes 52a and 52b respectively become unnecessary, so that the upper halves of the probes 52a and 52b can be comprised of the same metallic pins as the lower halves of those probes.

Figure 21:
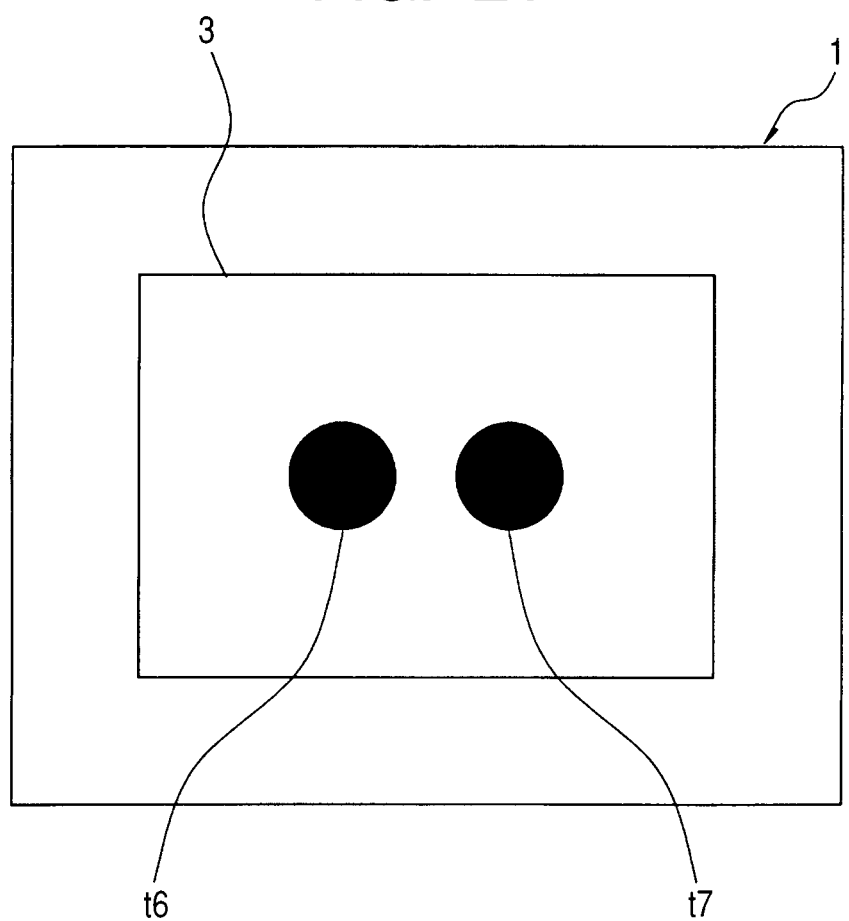
FIG. 21 is a plan view showing an example of probe traces formed on an electrode pad surface by wiping of the probe for Kelvin contact.

FIG. 21 is a plan view showing an example of traces formed on the surface of an electrode pad 3 by wiping of the Kelvin contact probe 51 described above. In FIG. 21, a trace ($t_6$) is of the POGO pin probe 52a and a trace ($t_7$) is of the POGO pin probe 52b. The direction of the traces is not limited to the direction shown in FIG. 21. For example, there can be a case where the traces are developed longitudinally or obliquely. Also as to the trace size, there can be both larger and smaller cases than the size shown in FIG. 21.

Although the present invention has been described above concretely by way of embodiments thereof, it goes without saying that the present invention is not limited to the above embodiments, but that various changes may be made within the scope not departing from the gist of the invention.

Figure 22:
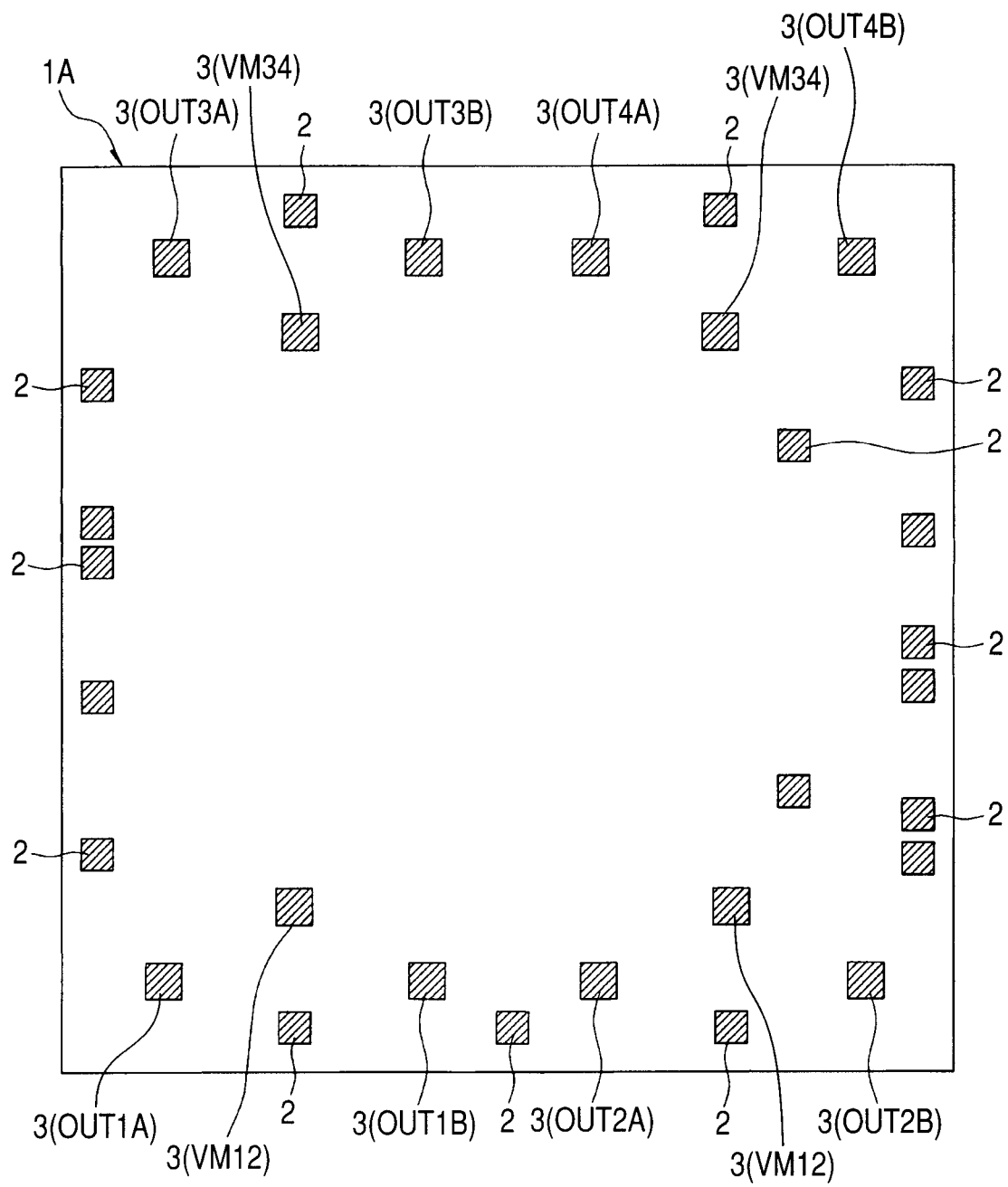
FIG. 22 is an enlarged plan view of a chip area, showing another example of an electrode pad shape for contact therewith of the probe for Kelvin contact.

For example, although in the above embodiments a planar shape of each of the power terminals and output terminals (electrode pads 3) in the output stages of the motor driver circuit is made rectangular, it may be square like the shape of each electrode pad 2 as shown in FIG. 22 for example. Also in this case, Kelvin contact may be carried out by juxtaposing two cantilever type probes described in the first embodiment. Further, by using the probes (21, 41, 51) for Kelvin contact described in the second to fourth embodiments, the area (B) of each electrode pad 3 can be further approximated to the area (A) of each electrode pad 2 for two-terminal measurement.

Although in the above embodiments the eighteen electrode pads 3 which configure the power terminals and output terminals in the output stages of the motor driver circuit are all made equal in size and shape, they may be made mutually different in size and shape. For example, in the case where the number of electrode pads 2 and 3 is small in comparison with the area of each chip area 1A (in the case where there is a margin in the arrangement of electrode pads), some of the electrode pads 3 may be made twice or more in area as large as each electrode pad 2 for two-terminal measurement.

Moreover, although in the above embodiments a description has been given about an example of applying the present invention to the fabrication of a CSP of the type in which re-wiring is performed on the chip (wafer) surface and plural solder balls are mounted, the present invention is applicable also to the manufacture of other semiconductor packages, e.g., a BGA (Ball Grid Array) package.

In this case, first the motor driver circuit formed in each chip area 1A of the wafer 1 is subjected to an electrical characteristics test (a predetermined electrical characteristics test including on resistance measurement in output stages), then whether each chip area 1A is good or bad is determined on the basis of the results of the test, and the wafer 1 is diced chip area 1A by chip area 1A.

Figure 23A:
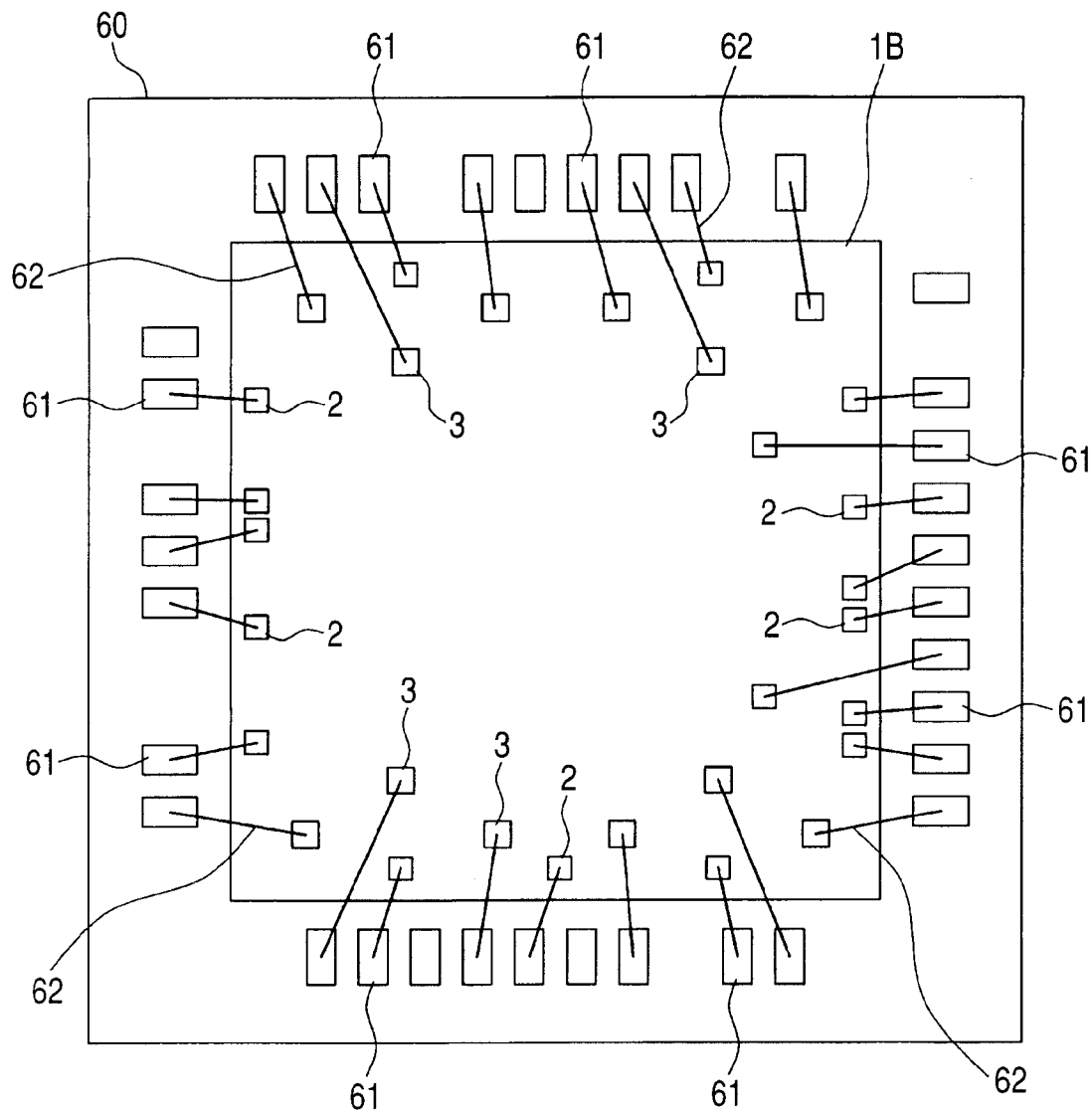
FIG. 23A is a plan view of a semiconductor device further embodying the present invention and FIG. 23B is a sectional view thereof.
Figure 23B:
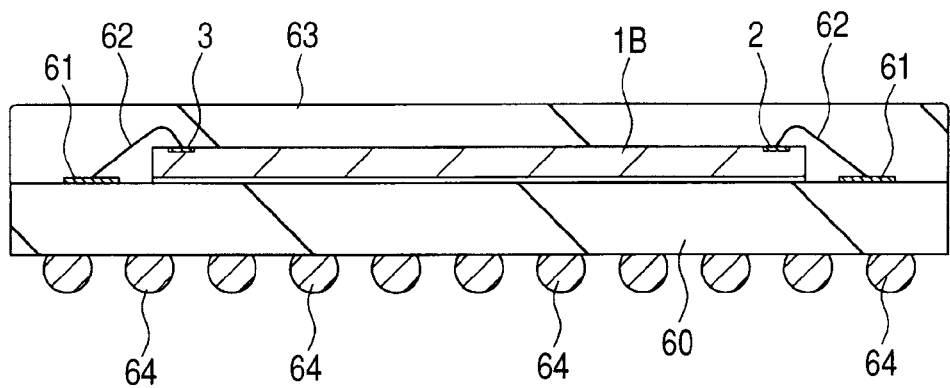

Next, as shown in FIG. 23, a semiconductor chip 1B which was determined to be good in the above electrical characteristics test is placed on a wiring substrate 60 of the BGA and electrodes 61 formed on an upper surface of the wiring substrate 60 and electrode pads 2, 3 of the semiconductor chip 1B are coupled together electrically using Au wires 62, thereafter the semiconductor chip 1B is sealed with molding resin 63. Subsequently, solder balls 64 are coupled to a lower surface of the wiring substrate 60, whereby the BGA is completed.

Further, although in the above embodiments a description has been given about an example of application of the present invention to measuring an on resistance in each output stage of the motor driver circuit, the invention is applicable not only to motor driver products but also to such large current value products as power MOS products and regulator products. That is, the present invention is applicable widely to the manufacture of semiconductor devices having an electrical characteristics testing process for integrated circuits which process uses the Kelvin contact method.

The present invention is applicable to the manufacture of a semiconductor device having an electrical characteristics testing process for a semiconductor integrated circuit with use of the Kelvin contact method.

What is claimed is:

1. A method for manufacturing a semiconductor device, comprising steps of:
   (a) providing a semiconductor wafer, the semiconductor wafer having a main surface partitioned into a plurality of chip areas;
   (b) forming a semiconductor integrated circuit in each of the chip areas;
   (c) forming a plurality of electrode pads over a surface of each of the chip areas, the electrode pads including a first electrode pad and a second electrode pad both coupled electrically to the semiconductor integrated circuit;
   (d) performing an electrical characteristics test for the semiconductor integrated circuit by contacting a probe or a plurality of probes with each of the electrode pads; and
   (e) after the step (d), dicing the semiconductor wafer to divide the wafer into the individual chip areas, thereby obtaining a plurality of semiconductor chips, wherein the area of the first electrode pad is larger than the area of the second electrode pad and the area of the first electrode pad is smaller than twice the area of the second electrode pad, and
   wherein the electrical characteristics test in the step (d) includes an electrical characteristics test using a Kelvin contact method in which two probes are brought into contact with the first electrode.

2. The method according to claim 1, wherein, given that the area of the first electrode pad is B and that of the second electrode pad is A, there exists a relation of A<B<2A.

3. The method according to claim 2, wherein cantilever type probes are used as the two probes for contact with the first electrode pad.

4. The method according to claim 3, wherein the two cantilever probes for contact with the first electrode pad are arranged side by side.

5. The method according to claim 4, wherein the first electrode pad is a power terminal or an output terminal.

6. The method according to claim 5, wherein the electrical characteristics test using the Kelvin contact method is a test of measuring an on resistance of each constituent element of the semiconductor integrated circuit.

7. The method according to claim 6, wherein the semiconductor integrated circuit is a motor driver circuit.

8. The method according to claim 7, wherein the first electrode pad is rectangular.

9. The method according to claim 8, further comprising, between the steps (d) and (e), a step of coupling a solder ball electrically to the first electrode pad.

10. The method according to claim 1, wherein the two probes for contact with the first electrode pad comprise a coil probe supported by a probe card and a POGO pin probe disposed inside the coil probe and supported by the probe card.

11. The method according to claim 10,
   wherein the POGO pin probe configures a force-side probe, while the coil probe configures a sense-side probe, and
   wherein when an electrical characteristics tester is not in operation, a tip portion of the POGO pin probe projects more downwards than a tip portion of the coil probe.

12. The method according to claim 10, wherein a surface of the POGO pin probe or a surface of the coil probe is coated for insulation except a lower end portion thereof which comes into contact with the first electrode pad.

13. The method according to claim 10,
   wherein a third probe for two-terminal measurement different from the two probes is supported by the probe card, and
   wherein the electrical characteristics test in the step (d) includes an electrical characteristics test involving contacting the probe for two-terminal measurement with the second electrode pad.

14. The method according to claim 1, wherein the second electrode pad is contacted by only one of the probes.

15. The method according to claim 1, wherein after step (d), two probe traces remain in a surface of the first electrode pad with which the two probes were brought into contact.

* * * * *